(12) United States Patent
Noda et al.

(10) Patent No.: US 7,978,745 B2
(45) Date of Patent: Jul. 12, 2011

(54) TWO-DIMENSIONAL PHOTONIC CRYSTAL SURFACE-EMITTING LASER

(75) Inventors: Susumu Noda, Kyoto (JP); Mitsuru Yokoyama, Takatsuki (JP); Takuji Hatano, Suita (JP)

(73) Assignees: Japan Science and Technology Agency, Kawaguchi-Shi (JP); Konica Minolta Opto, Inc., Hachioji-Shi (JP)

( * ) Notice: Subject to any disclaimer, the term of this patent is extended or adjusted under 35 U.S.C. 154(b) by 99 days.

(21) Appl. No.: 12/164,449

(22) Filed: Jun. 30, 2008

(65) Prior Publication Data

US 2009/0016395 A1 Jan. 15, 2009

Related U.S. Application Data

(62) Division of application No. 10/482,462, filed as application No. PCT/JP02/06764 on Jul. 3, 2002, now abandoned.

(30) Foreign Application Priority Data

Jul. 5, 2001 (JP) .................................. 2001-204315

(51) Int. Cl.
*H01S 5/18* (2006.01)
*H01S 5/12* (2006.01)
(52) U.S. Cl. ................... 372/50.11; 372/50.124
(58) Field of Classification Search ............... 372/50.11, 372/50.124
See application file for complete search history.

(56) References Cited

U.S. PATENT DOCUMENTS

| | | | | |
|---|---|---|---|---|
| 6,366,598 B1 | | 4/2002 | Nichols et al. | 372/102 |
| 6,683,898 B2 | * | 1/2004 | Østergaard et al. | 372/43.01 |
| 6,711,200 B1 | * | 3/2004 | Scherer et al. | 372/64 |
| 6,829,281 B2 | * | 12/2004 | Deng et al. | 372/96 |
| 7,050,471 B2 | * | 5/2006 | Brick et al. | 372/43.01 |
| 2004/0062505 A1 | * | 4/2004 | Sugitatsu et al. | 385/131 |
| 2004/0252741 A1 | * | 12/2004 | Meyer et al. | 372/67 |

FOREIGN PATENT DOCUMENTS

| | | |
|---|---|---|
| JP | 5-275806 A | 10/1993 |
| JP | 6-242313 A | 9/1994 |
| JP | 11-186657 A | 7/1999 |
| JP | 2000-332351 A | 11/2000 |
| JP | 2001-281473 A | 10/2001 |

(Continued)

OTHER PUBLICATIONS

English translation of the Japanese Office Action, dated Feb. 24, 2004, for counterpart Japanese Patent Application No. 2001-204315.

(Continued)

*Primary Examiner* — Minsun Harvey
*Assistant Examiner* — Marcia A. Golub-Miller
(74) *Attorney, Agent, or Firm* — Sidley Austin LLP

(57) ABSTRACT

Two-dimensional photonic crystal surface-emitting laser comprising a two-dimensional photonic crystal, having media different in refractive index arrayed in a two-dimensional cycle, disposed in the vicinity of an active layer that emits light by the injection of carriers, wherein the two-dimensional photonic crystal consists of square lattices having equal lattice constants in perpendicular directions, and a basic lattice consisting of a square with one medium as a vertex has an asymmetric refractive index distribution with respect to either one of the two diagonals of the basic lattice to thereby emit light in a constant polarizing direction.

7 Claims, 30 Drawing Sheets

FOREIGN PATENT DOCUMENTS

WO WO 02/073753 A2 9/2002

OTHER PUBLICATIONS

Technical Survey, Mar. 1999, vol. 82, No. 3, pp. 232-241.

Masahiro Imada et al, Coherent two-dimensional lasing action in surface-emitting laser with triangular-lattice photonic crystal structure, Applied Physics Letters, Jul. 19, 1999, vol. 75, No. 3, pp. 316-318.

O. Painter et al, "Two-Dimensional Photonic Band-Gap Defect Mode Laser", www.sciencemag.org, Science, Jun. 11, 1999, vol. 284, pp. 1819-1821.

Susumu Noda et al, "Polarization Mode Control of Two-Dimensional Photonic Crystal Laser by Unit Cell Structure Design", www.sciencemag.org, Science, Aug. 10, 2001, vol. 293, pp. 1123-1125.

Erchak et al, Applied Physics Letters, vol. 78 No. 5, Jan. 29, 2001, pp. 563-565.

Hwang et al, Applied Physics Letters, vol. 76 No. 21, May 22, 2000, pp. 2982-2984.

EP Communication transmitting "Supplemental European Search Report", dated May 23, 2005, for counterpart European Patent Application No. EP 02 74 3816.

Cheryl M. Anderson et al; "Symmetry Reduction in group 4mm Photonic Crystals", Physical Review B, The American Physical Society, vol. 56, No. 12, Sep. 15, 1997, pp. 7313-7320.

Nobuhiko Susa, "Threshold Gain and Gain-Enhancement Due to Distributed-Feedback in Two-Dimensional Photonic-Crystal Lasers", Journal of Applied Physics, American Institute of Physics, vol. 89, No. 2, Jan. 15, 2001, pp. 815-823.

Serge F. Mingaleev et al, "Nonlinear Localized Modes in 2D Photonic Crystals", Quantum Electronics and Laser Science Conference, Postconference Technical Digest, May 6, 2001, p. 2.

Alongkarn Chutinan et al, "Waveguides and Waveguide Bends in Two-Dimensional Photonic Crystal Slabs", Physical Review B, The American Physical Society, vol. 62, No. 7, Aug. 15, 2000, pp. 4488-4492.

\* cited by examiner

FIG. 34
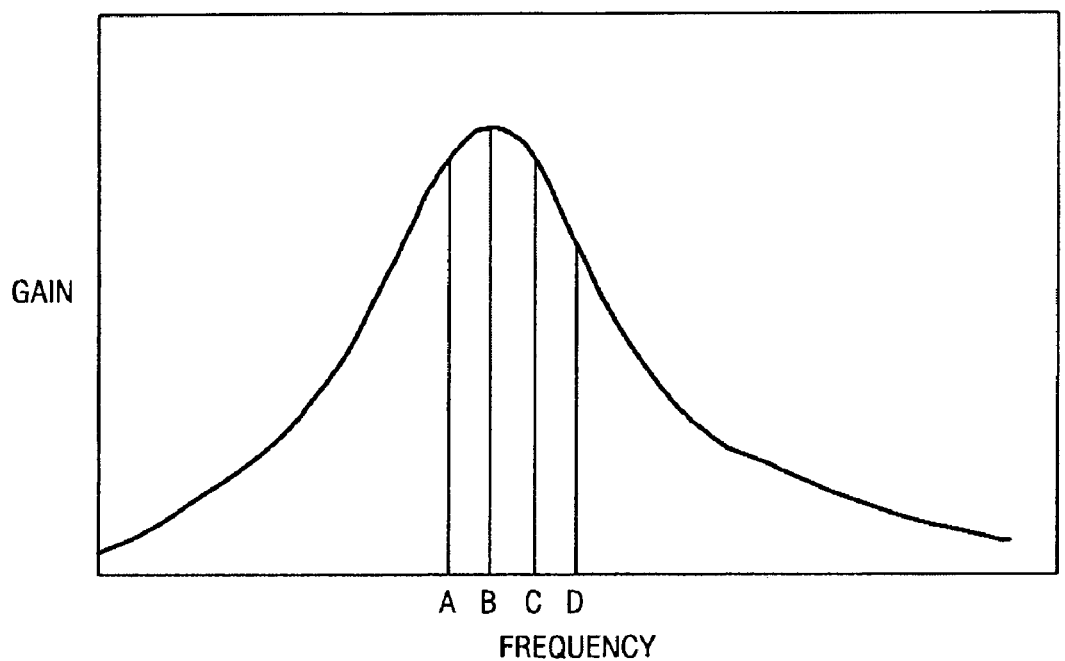
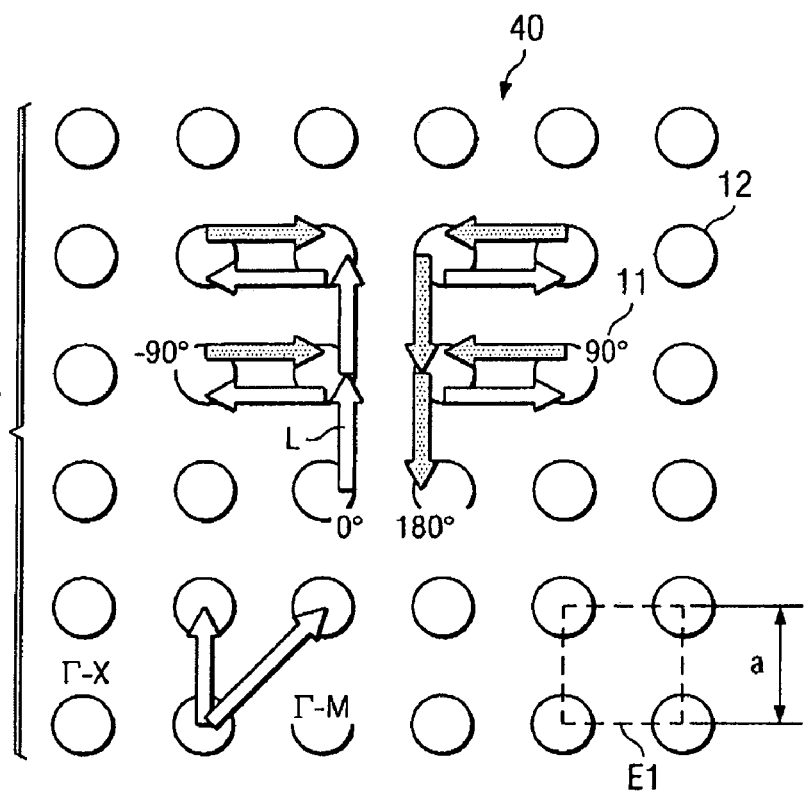
FIG. 35
(PRIOR ART)

MODE A

→ = 1.000e+000

MODE B

TWO-DIMENSIONAL PHOTONIC CRYSTAL SURFACE-EMITTING LASER

RELATED APPLICATIONS

This application is a divisional of U.S. application Ser. No. 10/482,462, filed Jul. 21, 2004, now abandoned which is a National Stage of International Application No. PCT/JP02/06764, filed Jul. 3, 2002, which is based on Japanese Patent Application No. 2001-204315, the entire contents of which is incorporated herein by reference.

TECHNICAL FIELD

The present invention relates to a two-dimensional photonic crystal surface-emitting laser that has a two-dimensional photonic crystal so as to be capable of surface light emission.

BACKGROUND ART

Japanese Patent Application Laid-Open No. 2000-332351 discloses a two-dimensional photonic crystal surface-emitting laser having a two-dimensional photonic crystal placed near an active layer so as to achieve surface light emission by exploiting the resonance of the two-dimensional photonic crystal. The two-dimensional photonic crystal surface-emitting laser disclosed in this publication has a lower clad layer, an active layer, and an upper clad layer laid on a substrate. The lower clad layer incorporates a two-dimensional photonic crystal near the active layer.

The two-dimensional photonic crystal is produced by forming hollow holes in a semiconductor layer of, for example, n-type InP, and is formed as a triangular or square lattice having media having different refractive indices arrayed with a predetermined two-dimensional period. The hollow holes may be filled with SiN or the like. The active layer is formed as a multiple quantum well structure using, for example, an InGaAs/InGaAsP-based semiconductor material, and emits light when carriers are injected into it.

The lower clad layer is formed of, for example, an n-type InP semiconductor as described above, and the upper clad layer is formed of, for example, a p-type InP semiconductor. The active layer is sandwiched between the lower and upper clad layers to form a double hetero junction and thereby confine carriers so that the carriers that contribute to light emission concentrate in the active layer.

On the top surface of the upper clad layer and on the bottom surface of the substrate, there are formed electrodes of gold or the like. When a voltage is applied between the electrodes, the active layer emits light, and an evanescent component that leaks out of the active layer enters the two-dimensional photonic crystal. Light having a wavelength coincident with the lattice constant of the two-dimensional photonic crystal resonates with it, and is thereby amplified. As a result, the two-dimensional photonic crystal achieves surface light emission, emitting coherent light.

For example, in a two-dimensional photonic crystal formed as a square lattice as shown in FIG. 35, resonance occurs in the following manner. The two-dimensional photonic crystal 40 is formed as a square lattice having a second medium 12 in the form of hollow holes or the like formed with equal periods in two mutually perpendicular directions within a first medium 11. The square lattice has representative directions called the Γ-X and Γ-M directions, respectively. Let the interval between two patches of the second medium 12 that are mutually adjacent in the Γ-X direction (hereinafter, this interval will be referred to as the "lattice constant") be "a," then there exist a plurality of square lattice sections E1 having lattice points at patches of the second medium 12 and measuring "a" on each side (hereinafter, such a section will be referred to representatively as the "fundamental lattice").

When light L having a wavelength "λ" coincident with the lattice constant "a" of the fundamental lattice E1 propagates in the Γ-X direction, the light L is diffracted at lattice points. Of the different components of the light, only those diffracted in the directions of 0°, ±90°, and 180° with respect to the direction of propagation of the light fulfill the Bragg condition. Lattice points exist also in the directions of propagation of the light that has been diffracted in the directions of 0°, ±90°, and 180°, and thus the diffracted light is diffracted again in the directions of 0°, ±90°, and 180° with respect to its direction of propagation.

When light L from one lattice point is refracted once or more than once, the diffracted light returns to the original lattice point. This causes resonance. On the other hand, the light diffracted in the direction perpendicular to the plane of the figure also fulfills the Bragg condition. As a result, light amplified through resonance is emitted through the upper clad layer, achieving surface light emission. This phenomenon occurs at every lattice point, permitting coherent laser emission all over the surface area.

FIG. 36 is a band diagram of the two-dimensional photonic crystal 40 structured as shown in FIG. 35. Along the vertical axis is taken the normalized frequency, i.e., the frequency of light normalized by being multiplied by "a/c," where "c" represents the speed of light (in m/sec) and "a" represents the lattice constant (in m). Along the horizontal axis is taken the wave-number vector of light.

In this figure, the plotted lines indicate the dispersion relation of light. The figure shows that there are a few places in it where the gradient is zero. This means that there are a few points where the group velocity of light is zero and thus resonance occurs. In particular, at the point Γ, as described above, not only light diffracted in different directions within the plane but also light diffracted in the direction perpendicular to the plane fulfils the Bragg condition, and accordingly it is possible to extract, in the direction perpendicular to the plane, coherent light produced through resonance in different directions within the plane.

Incidentally, the point Γ is defined in the following manner. Let the unit vectors in a rectangular coordinate system be "x" and "y," then the primitive translational vectors "$a_1$" and "$a_2$" with respect to a square lattice with a lattice constant "a" are given by $a_1 = ax$ $a_2 = ay$ For the translational vectors "$a_1$" and "$a_2$," the primitive reciprocal lattice vectors "$b_1$" and "$b_2$" are given by $b_1 = (2\pi/a)y$ $b_2 = (2\pi/a)x$ On the basis of the primitive reciprocal lattice vectors "$b_1$" and "$b_2$," the point at which the wave-number vector "k" of light has the value given by formula (1) below is called the Γ point.

$$k = nb_1 + mb_2 \tag{1}$$

where "n" and "m" are arbitrary integers.

Accordingly, at the Γ point, where the wave-number vector of light fulfills formula (1), the aforementioned phenomenon occurs in any band. In a two-dimensional photonic crystal surface-emitting laser, as indicated by the part S in the figure, it is typical to use the second order band, which corresponds to the case in which the lattice constant "a" is equal to the wavelength "λ."

FIG. 37 shows the details of the part S. The two-dimensional photonic crystal has four frequencies, namely A, B, C, and D in order of increasing frequency, at which the group velocity is zero; that is, it has four resonant frequencies. Hereinafter, the resonant states at the resonant frequencies A, B, C, and D will be referred to as the modes A, B, C, and D, respectively.

FIGS. 38 and 39 show the electric field distributions observed when the two-dimensional photonic crystal is in the mode-A and mode-B resonant states, respectively. These images are the near field pattern images at the time of laser oscillation. Arrows indicate the directions and magnitudes of electric fields. As shown in these figures, in the modes A and B, the directions of electric fields are not uniform. That is, the polarization direction is not uniform. As a result, as shown in FIGS. 40 and 41, which show the electric field distributions in the far field pattern in the modes A and B, the polarization direction in the mode A is such as to run around an electrode 7, and the polarization direction in the mode B is such as to radiate to and from the electrode 7.

On the other hand, the modes C and D are degenerated so that those resonant states occur at the same frequency. Thus, at the point Γ, how polarization occurs is determined by the linear sum of the electric field distributions ascribable to the modes C and D. Thus, the polarization direction is not uniquely determined but remains unstable.

As described above, with a conventional two-dimensional photonic crystal surface-emitting laser, no matter in which of the four resonant modes (practically three, since the modes C and D are degenerated) of the two-dimensional photonic crystal it is formed to resonate, the polarization direction of the light emitted from it is not uniform. This makes the conventional two-dimensional photonic crystal surface-emitting laser unusable in devices that use uniformly polarized light.

DISCLOSURE OF THE INVENTION

An object of the present invention is to provide a two-dimensional photonic crystal surface-emitting laser that can emit uniformly polarized light.

To achieve the above object, according to one aspect of the present invention, in a two-dimensional photonic crystal surface-emitting laser having a two-dimensional photonic crystal that has media having different refractive indices arrayed with a two-dimensional period and that is placed near an active layer that emits light when carriers are injected thereinto, the two-dimensional photonic crystal is formed as a square lattice having patches of one medium arrayed periodically at equal intervals in two mutually perpendicular directions, and at least part of fundamental lattices, of which each has the shape of a square that has its vertices at patches of the one medium and of which the length of each side equals the minimum period of equally sized patches of the one medium, has an asymmetric refractive index distribution with respect to one of the two diagonal lines of those fundamental lattices.

According to another aspect of the present invention, in a two-dimensional photonic crystal surface-emitting laser having a two-dimensional photonic crystal that has media having different refractive indices arrayed with a two-dimensional period and that is placed near an active layer that emits light when carriers are injected thereinto, the degeneration of modes at the Γ point of the two-dimensional photonic crystal is resolved.

With these structures, it is possible to resolve mode degeneration by breaking the crystal symmetry of the two-dimensional photonic crystal or by another means. This makes it possible to make the two-dimensional photonic crystal resonate at four different frequencies in the second order Γ point of its band diagram through appropriate setting of the refractive indices and sizes of the media and other parameters.

According to the present invention, the two-dimensional photonic crystal surface-emitting lasers described above may be so structured that the frequency at which the active layer exhibits the maximum gain is coincident with the frequency at which the two-dimensional photonic crystal resonates.

According to the present invention, the two-dimensional photonic crystal surface-emitting lasers described above may be so structured that the two-dimensional photonic crystal has a first medium that has a predetermined refractive index and a second medium that has a refractive index different from the refractive index of the first medium and of which equally sized patches are arrayed at equal intervals in mutually perpendicular first and second directions within the first medium, and that at least part of fundamental lattices that have their vertices at patches of the second medium have a third medium of which patches are arrayed asymmetrically with respect to one of the two diagonal lines of those fundamental lattices. With this structure, the patches of the third medium are arrayed, for example, at random positions within the first medium.

According to the present invention, the two-dimensional photonic crystal surface-emitting lasers described above may be so structured that, assuming that the length of each side of the fundamental lattices is "a," the patches of the third medium are arrayed within a width of "0.1a" of one side of the fundamental lattices or within a width of "0.1 a" of the bisecting normal to one side of the fundamental lattices.

According to the present invention, the two-dimensional photonic crystal surface-emitting lasers described above may be so structured that, assuming that the length of each side of the fundamental lattices is "a" and that the first and second directions are, with an origin set at patches of the second medium, the X- and Y-axes, the patches of the third medium are arrayed within a radius of "0.1a" of points of which the X- and Y-coordinates are ($na/4$, $ma/4$), where $n=0$, 2, and 4, and $m=1$ and 3 or ($na/4$, $ma/4$), where $n=1$ and 3, and $m=0$, 2, and 4.

With this structure, patches of the third medium are arrayed, for example, at positions (0, a/4), (0, 3a/4), and (a/4, a/2).

According to the present invention, the two-dimensional photonic crystal surface-emitting lasers described above may be so structured that the patches of the second medium and the patches of the third medium are differently sized.

According to the present invention, the two-dimensional photonic crystal surface-emitting lasers described above may be so structured that the second medium and the third medium are formed of the same material.

According to the present invention, the two-dimensional photonic crystal surface-emitting lasers described above may be so structured that the two-dimensional photonic crystal has a first medium that has a predetermined refractive index and a second medium that has a refractive index different from the refractive index of the first medium and of which patches are arrayed at equal intervals in mutually perpendicular first and second directions within the first medium, and that, at least in part of fundamental lattices that have their vertices at patches of the second medium, the patches of the second medium have, as seen in a plan view, an asymmetrical shape with respect to one of the two diagonal lines of those fundamental lattices. With this structure, the patches of the second medium are arrayed periodically in the first and second directions, and the patches of the second medium are formed to have, for example, the shape of an ellipse of which the major axis is coincident with the first direction.

According to the present invention, the two-dimensional photonic crystal surface-emitting lasers described above may be so structured that the two-dimensional photonic crystal has patches of different media, each rectangular in shape as seen in a plan view, arrayed in close contact with one another, and, with respect to the patches of at least one medium, the patches of two other media adjacent thereto in two mutually perpendicular directions have different refractive indices.

With this structure, the two-dimensional photonic crystal is formed to have a checkered pattern with patches of media having different refractive indices arrayed adjacent to one another so that, for example, as seen in a plan view, patches of the second medium arrayed above patches of the first medium have a different refractive index from patches of the third medium arrayed on the right and left of patches of the first medium. At positions diagonal to patches of the first medium may be arrayed patches of one of the first to third media or patches of another medium. Moreover, patches of the first medium may be arrayed with an interval equal to the wavelength or equal to a period that fulfils the conditions for the wave-number vector at the Γ point defined earlier. Even though the fundamental lattice is square, the patches of the individual media do not have to be square.

According to the present invention, the two-dimensional photonic crystal surface-emitting laser described above may be so structured that the two-dimensional photonic crystal is formed by cementing together two one-dimensional diffraction gratings having equal periods in such a way that the directions of the periods thereof are perpendicular to each other.

With this structure, for example, by cementing together a first and a second diffraction grating that each have grooves formed with a predetermined one-dimensional period and that are formed of a first and a second medium, respectively, having different refractive indices, it is possible to form a two-dimensional photonic crystal in which the refractive index at places where the grooves of the first and second diffraction gratings overlap, the average refractive index at places where the grooves of the first diffraction grating overlap the second medium, the average refractive index at places where the grooves of the second diffraction grating overlap the first medium, and the average refractive index at places where the first and second media overlap are different from one another.

BRIEF DESCRIPTION OF DRAWINGS

FIG. 34 is a diagram showing the relationship between the gain and the frequency of the light emitted from the active layer.

FIG. 35 is a plan view of a conventional two-dimensional photonic crystal.

BEST MODE FOR CARRYING OUT THE INVENTION

Figure 1:
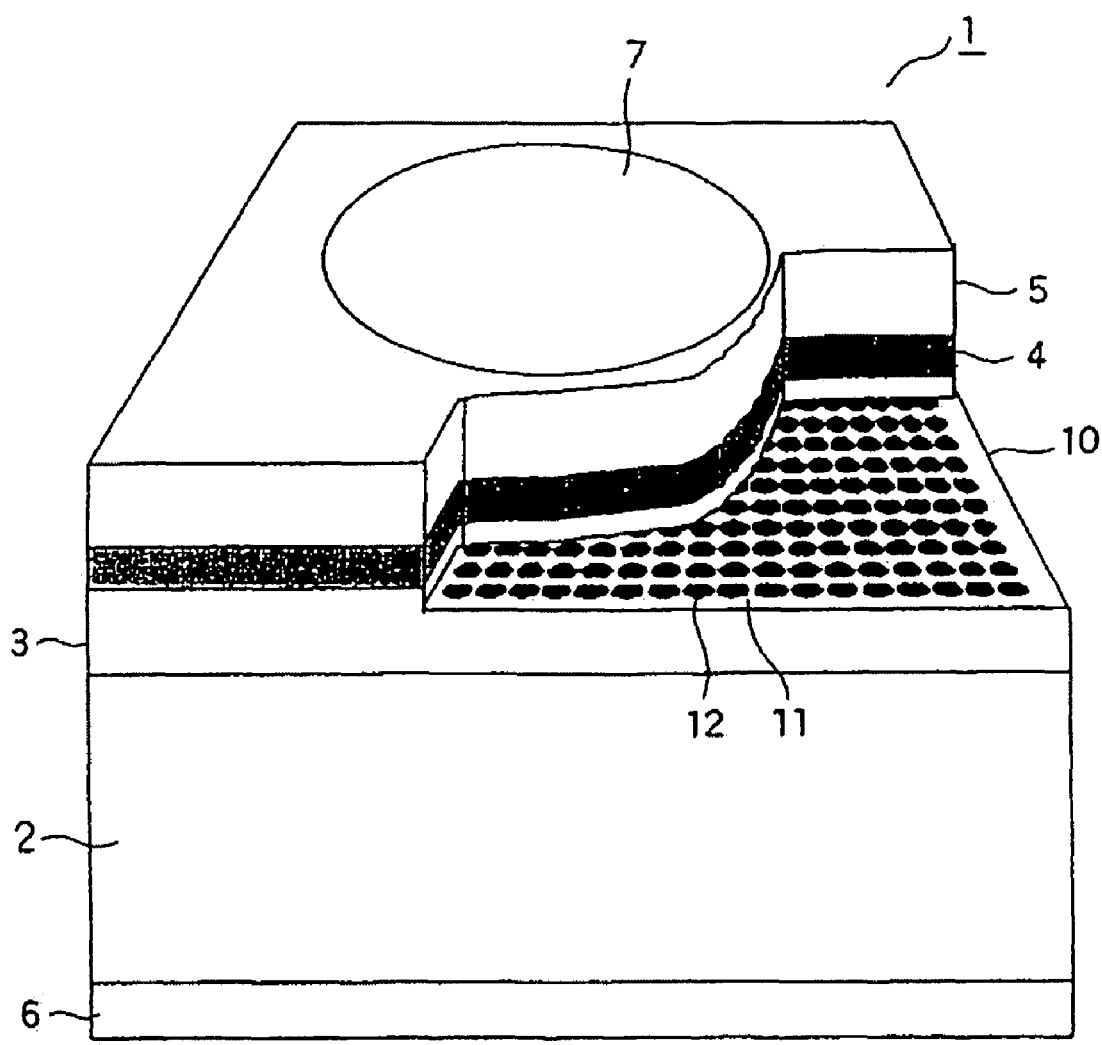
FIG. 1 is a partially cutaway perspective view of the two-dimensional photonic crystal surface-emitting laser of a first embodiment of the invention.

Hereinafter, embodiments of the present invention will be described with reference to the drawings. For convenience's sake, in the following descriptions, such elements as are found also in the conventional example shown in FIG. 35 are identified with the same reference numerals. FIG. 1 is a perspective view of the two-dimensional photonic crystal surface-emitting laser of a first embodiment of the invention. The two-dimensional photonic crystal surface-emitting laser 1 has a lower clad layer 3, an active layer 4, and an upper clad layer 5 laid on top of a substrate 2. The lower clad layer 3 incorporates a two-dimensional photonic crystal 10 near the active layer 4.

The two-dimensional photonic crystal 10 is produced by forming hollow holes in a semiconductor layer of, for example, n-type InP, and is formed as a square lattice having media having different refractive indices arrayed with a predetermined two-dimensional period. The hollow holes may be filled with SiN or the like. The active layer 4 is formed as a multiple quantum well structure using, for example, an InGaAs/InGaAsP-based semiconductor material, and emits light when carriers are injected into it.

The lower clad layer 3 is formed of, for example, an n-type InP semiconductor as described above, and the upper clad layer 5 is formed of, for example, a p-type InP semiconductor. The active layer 4 is sandwiched between the lower and upper clad layers 3 and 5 to form a double hetero junction and thereby confine carriers so that the carriers that contribute to light emission concentrate in the active layer. On the top surface of the upper clad layer 5 and on the bottom surface of the substrate 2, there are formed electrodes 6 and 7 of gold or the like. When a voltage is applied between the electrodes 6 and 7, the active layer 4 emits light.

Figure 2:
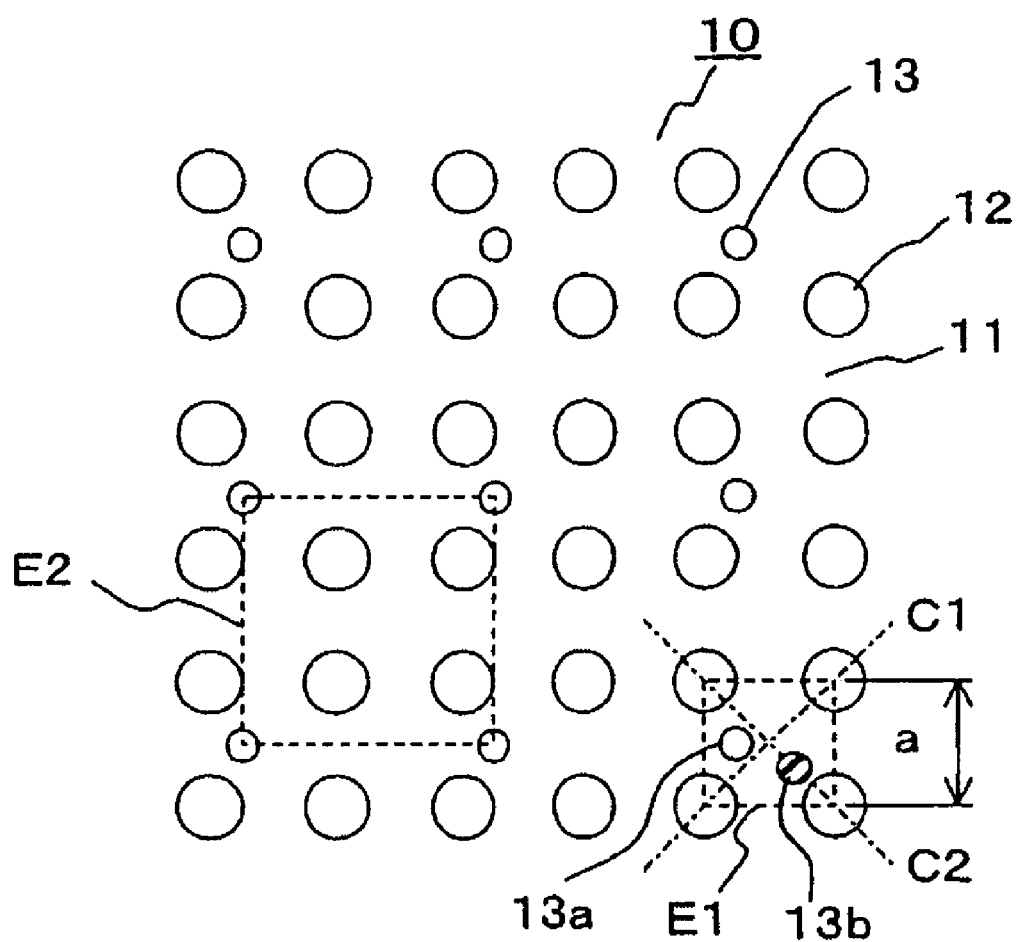
FIG. 2 is a plan view of the two-dimensional photonic crystal of the first embodiment of the invention.
Figure 36:
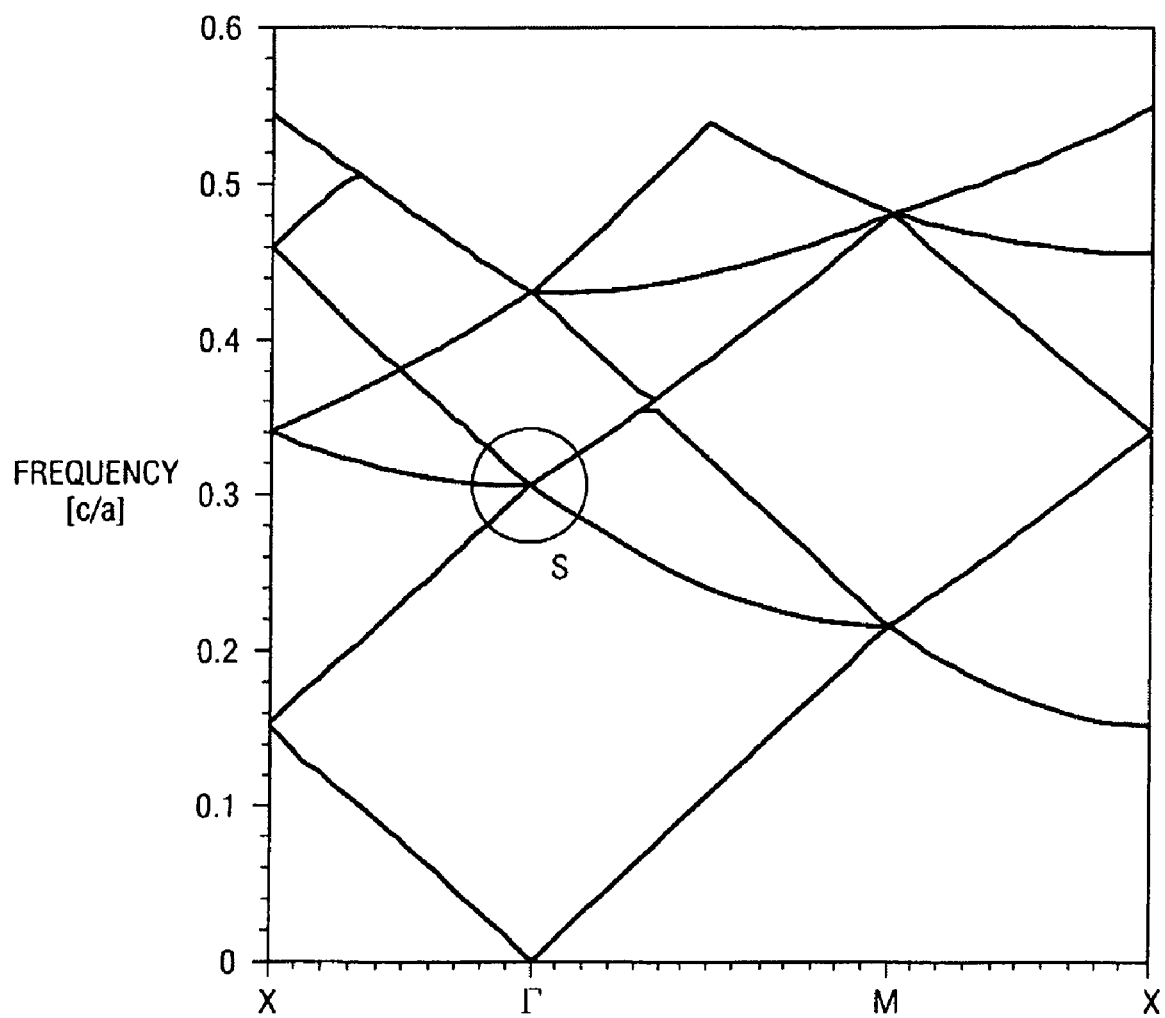
FIG. 36 is a band diagram of a conventional two-dimensional photonic crystal.

FIG. 2 is a plan view of the two-dimensional photonic crystal 10. The two-dimensional photonic crystal 10 is formed as a square lattice having a second medium 12 in the form of hollow holes or the like formed with equal periods (lattice constant "a") in two mutually perpendicular directions within a first medium 11. The basic lattice constant "a" may be equal to any period that fulfils the conditions for the wave-number vector at the point Γ. In this embodiment, a description is given of a case where the oscillation wavelength is equal to the lattice constant "a" that corresponds to the second order Γ point (see FIG. 36, the part S), as most commonly practiced.

In the two-dimensional photonic crystal 10, there are formed fundamental lattices E1 of which each has the shape of a square that has its vertices at patches of the second medium 12 and of which the length of each side equals the minimum period (lattice constant "a") of equally sized patches of the second medium 12. Moreover, there are formed patches of a third medium 13 at predetermined positions, one every two periods in each of two mutually perpendicular directions with respect to the second medium 12.

As described earlier, an evanescent component that leaks out of the active layer 4 enters the two-dimensional photonic crystal 10. When the lattice constant "a" of the two-dimensional photonic crystal 10 equals a predetermined length, the light resonates with the two-dimensional photonic crystal 10 and is thereby amplified. As a result, the two-dimensional photonic crystal surface-emitting laser 1 achieves surface light emission, emitting coherent light. Here, within each fundamental lattice E1 that includes a patch of tie third medium 13, the patch of the third medium 13 is located at a position asymmetric with respect to both of the diagonal lines C1 and C2 of the fundamental lattice E1.

Incidentally, the fundamental lattice denotes the square lattice section having the minimum period that has its vertices at patches of the same medium, and is therefore different from the so-called unit lattice, which is the minimum unit of a periodical structure. Accordingly, lattice sections E2 having its vertexes at patches of the third medium 13 may be regarded as the fundamental lattice. Even then, patches of the second medium 12 are arrayed at positions asymmetric with respect to both of the two diagonal lines of the fundamental lattice.

Figure 3:
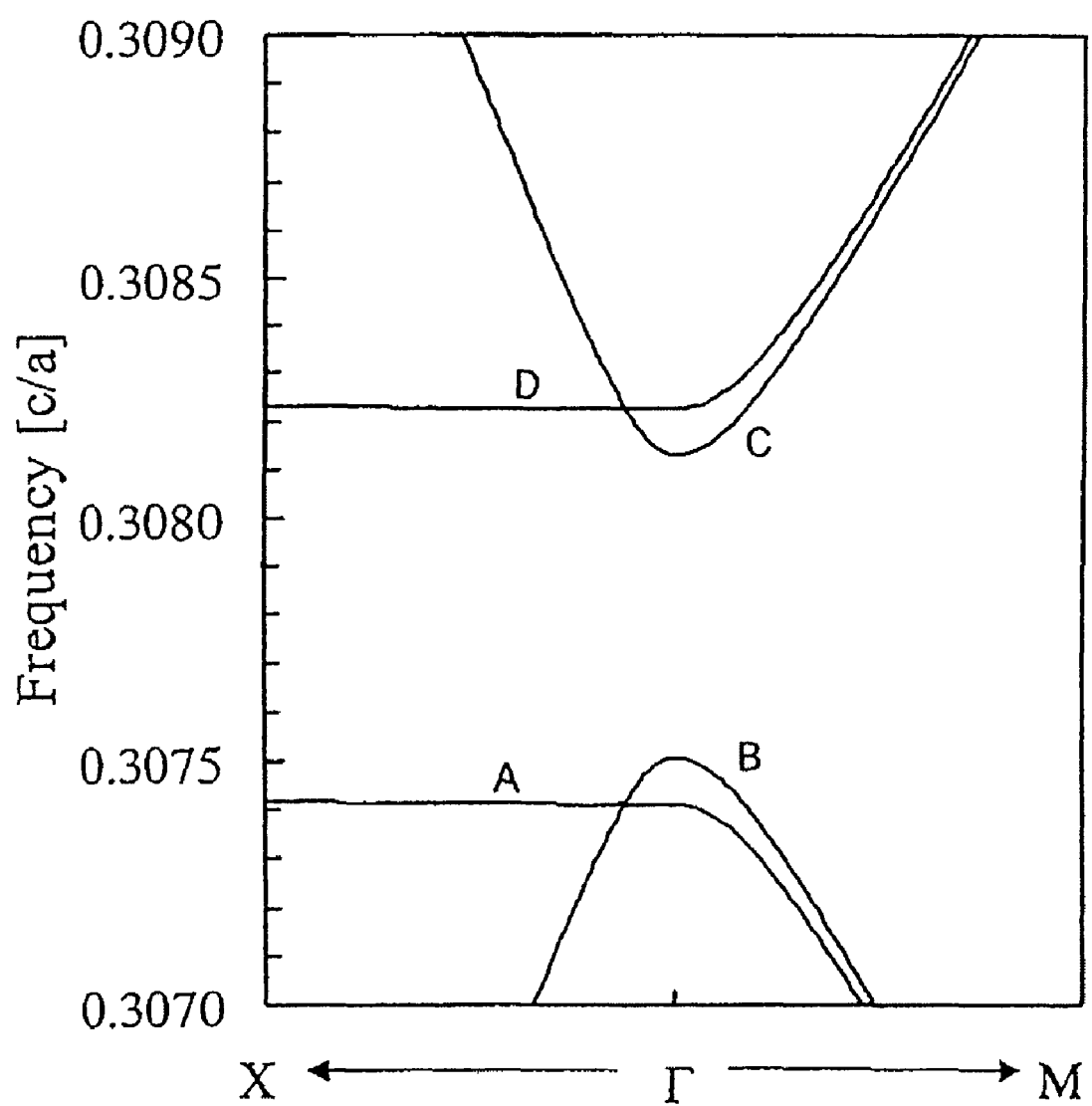
FIG. 3 is a band diagram of the second order Γ point of the two-dimensional photonic crystal of the first embodiment of the invention.
Figure 4:
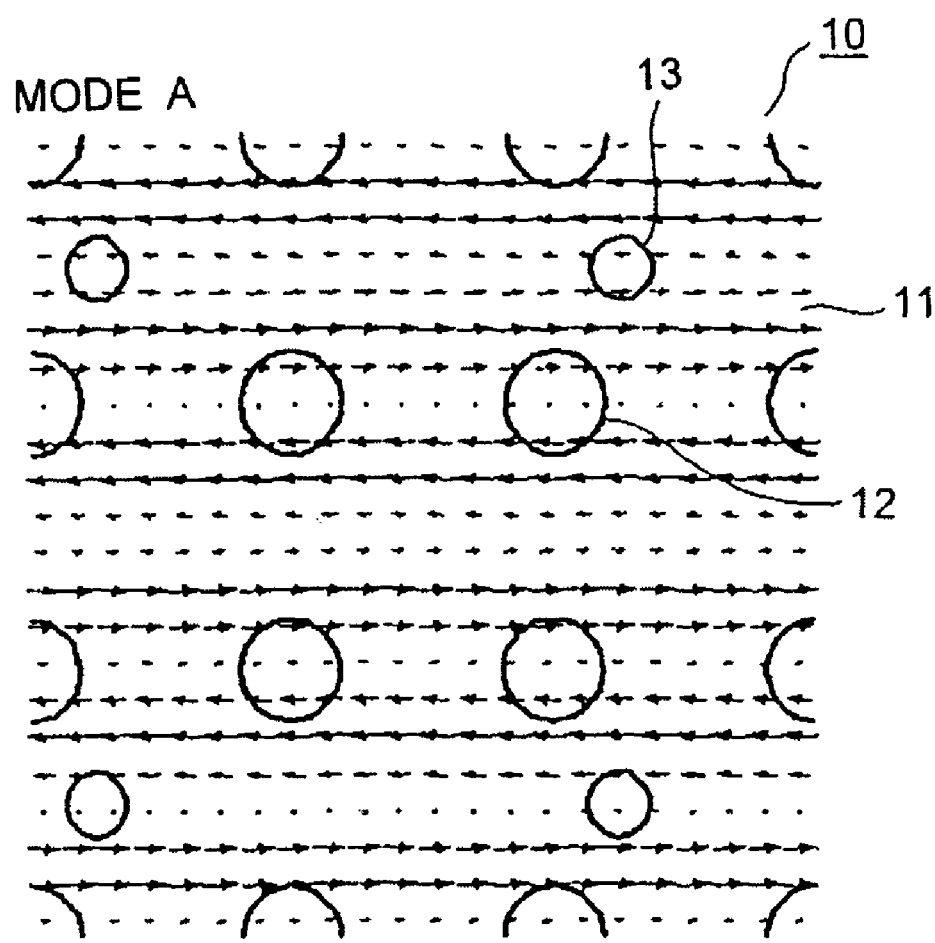
FIG. 4 is a diagram showing the electric field distribution in the near field pattern in the mode A of the two-dimensional photonic crystal of the first embodiment of the invention.
Figure 5:
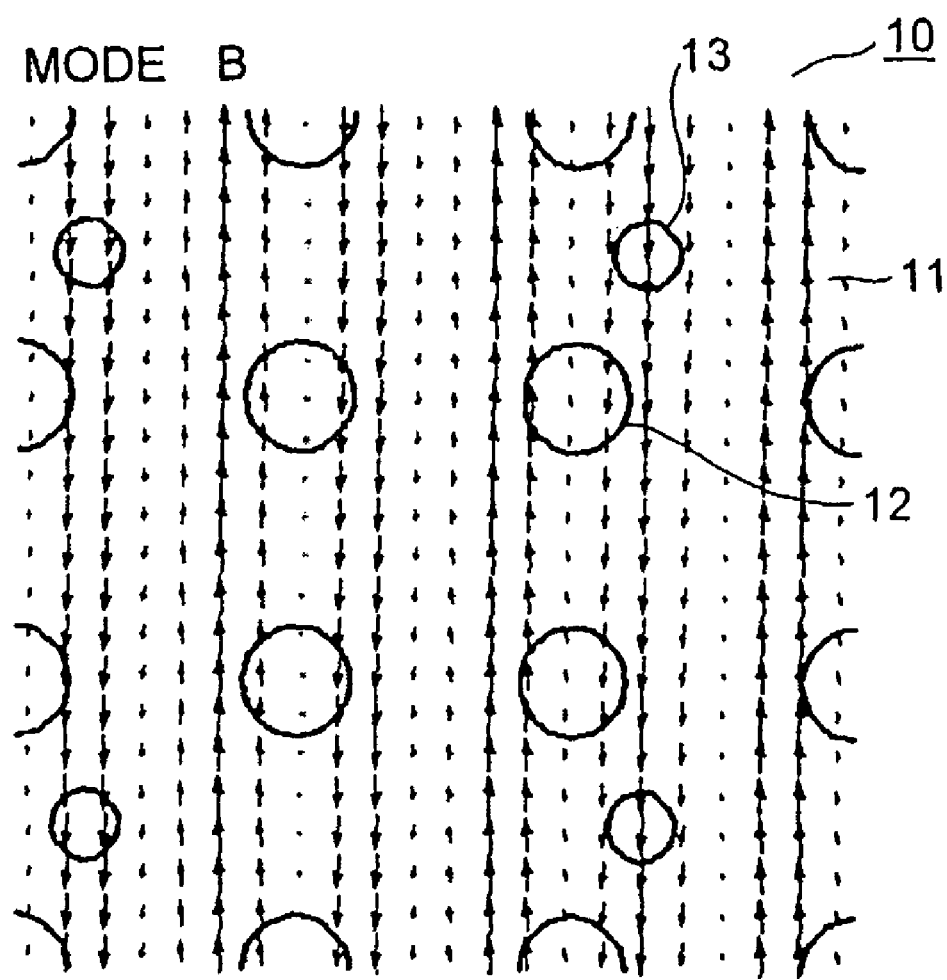
FIG. 5 is a diagram showing the electric field distribution in the near field pattern in the mode B of the two-dimensional photonic crystal of the first embodiment of the invention.
Figure 6:
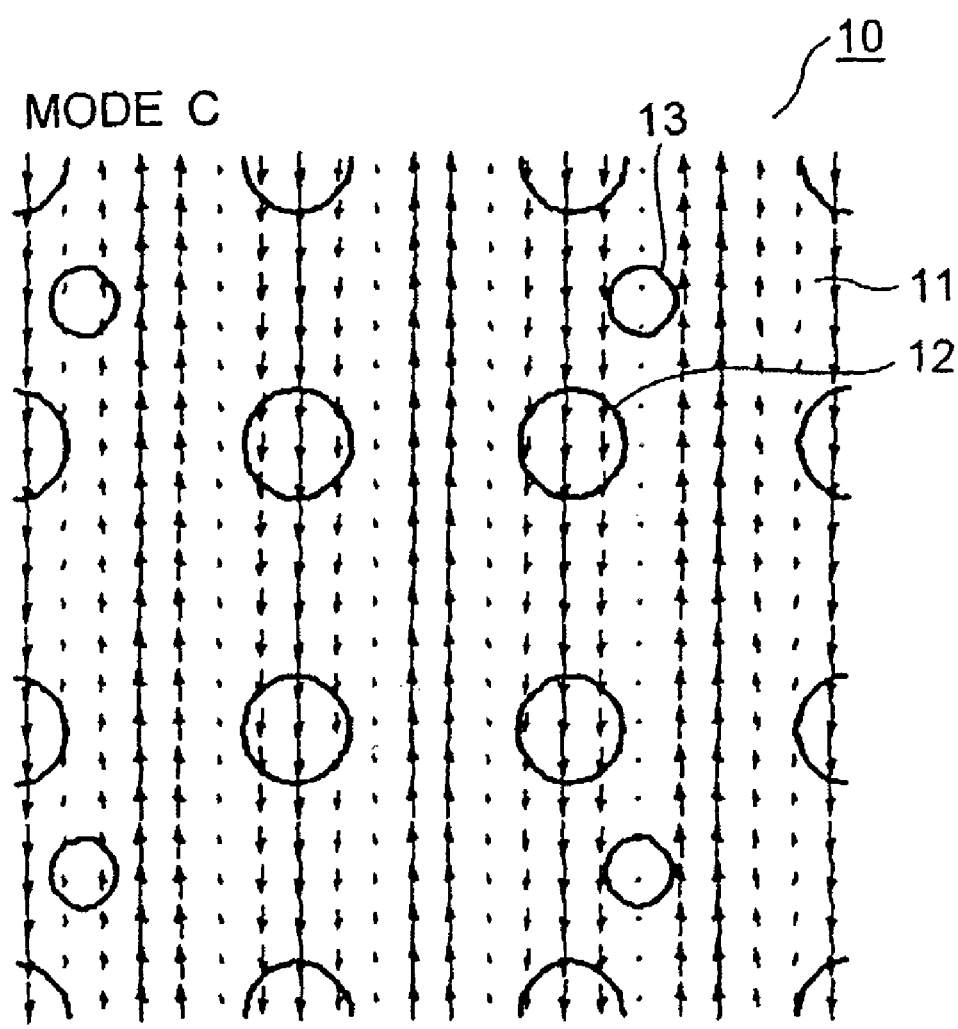
FIG. 6 is a diagram showing the electric field distribution in the near field pattern in the mode C of the two-dimensional photonic crystal of the first embodiment of the invention.
Figure 7:
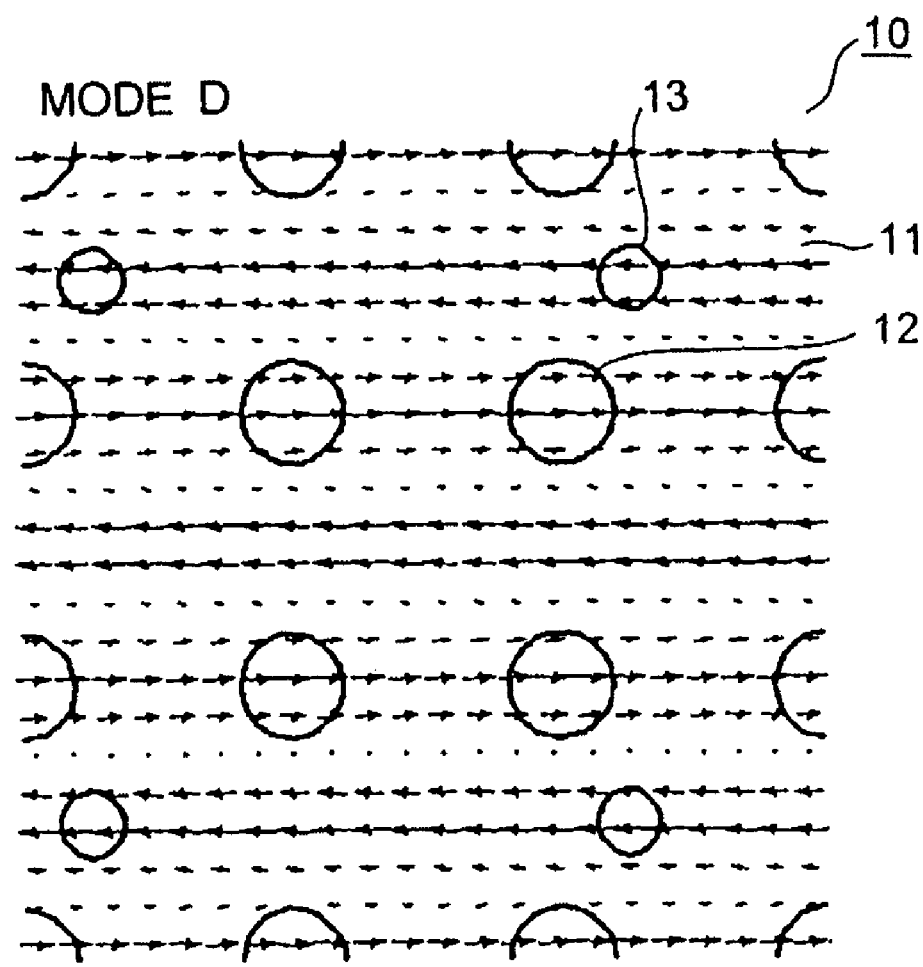
FIG. 7 is a diagram showing the electric field distribution in the near field pattern in the mode D of the two-dimensional photonic crystal of the first embodiment of the invention.

FIG. 3 is a band diagram near the point Γ of the two-dimensional photonic crystal 10 structured as described above. The figure shows the second order Γ point (see FIG. 36, the part S) in which the wavelength "λ" is coincident with the lattice constant "a." Along the vertical axis is taken the normalized frequency, i.e., the frequency of light normalized by being multiplied by "a/c," where "c" represents the speed of light (in m/sec) and "a" represents the lattice constant (in m). Along the horizontal axis is taken the wave-number vector of light.

Figure 37:
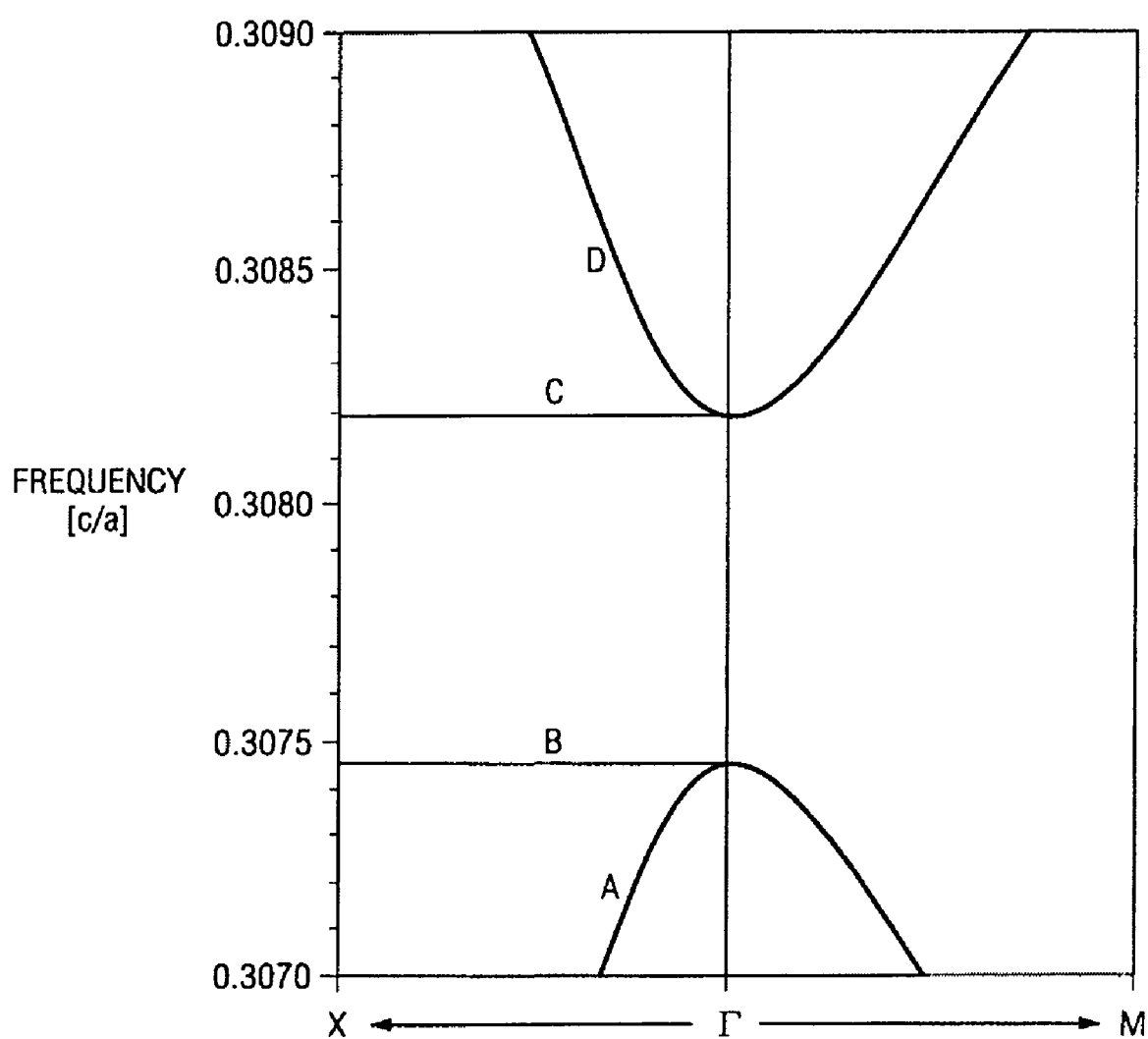
FIG. 37 is a band diagram of the second order Γ point of a conventional two-dimensional photonic crystal.
Figure 38:
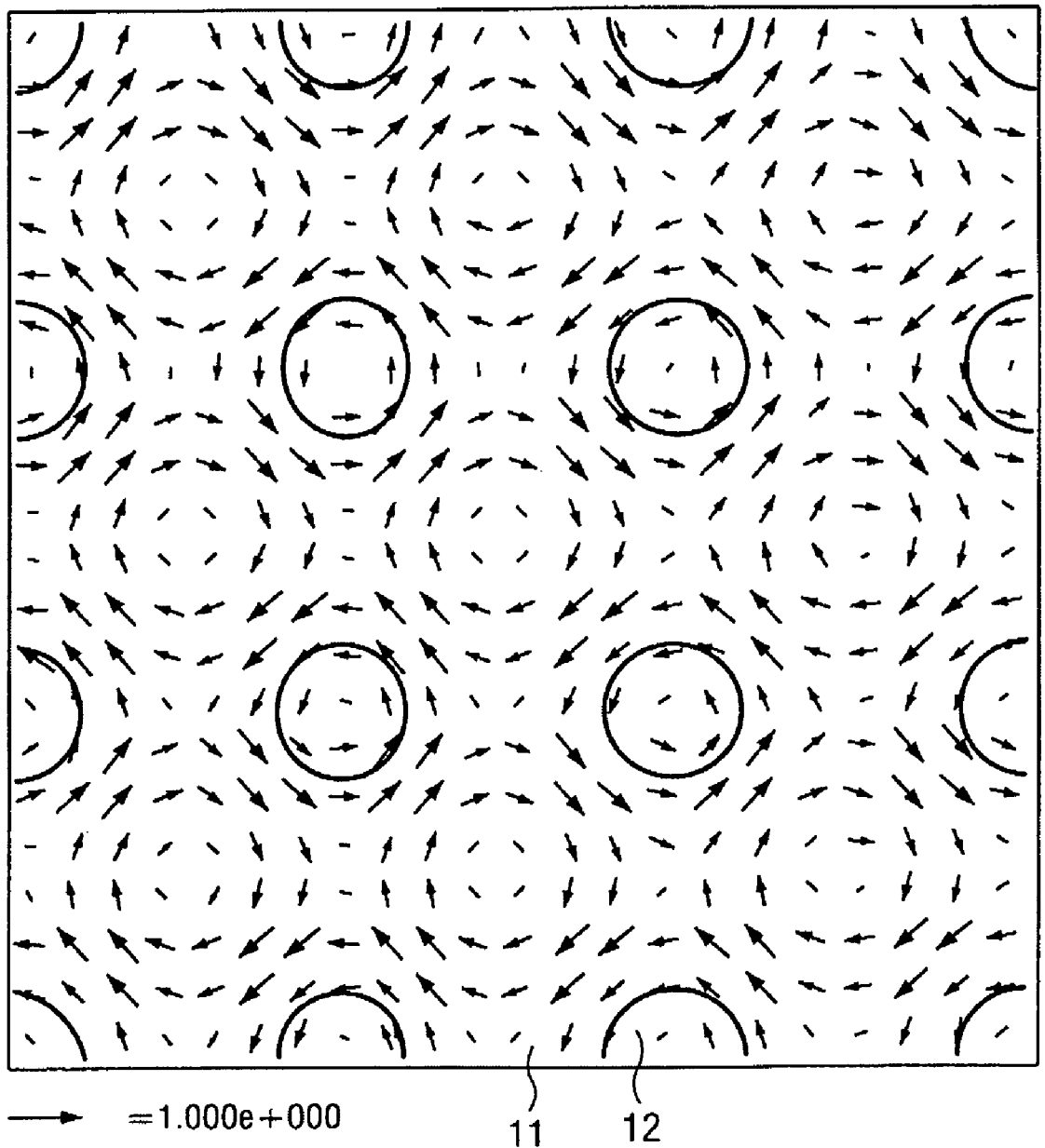
FIG. 38 is a diagram showing the electric field distribution in the near field pattern in the mode A of a conventional two-dimensional photonic crystal.
Figure 39:
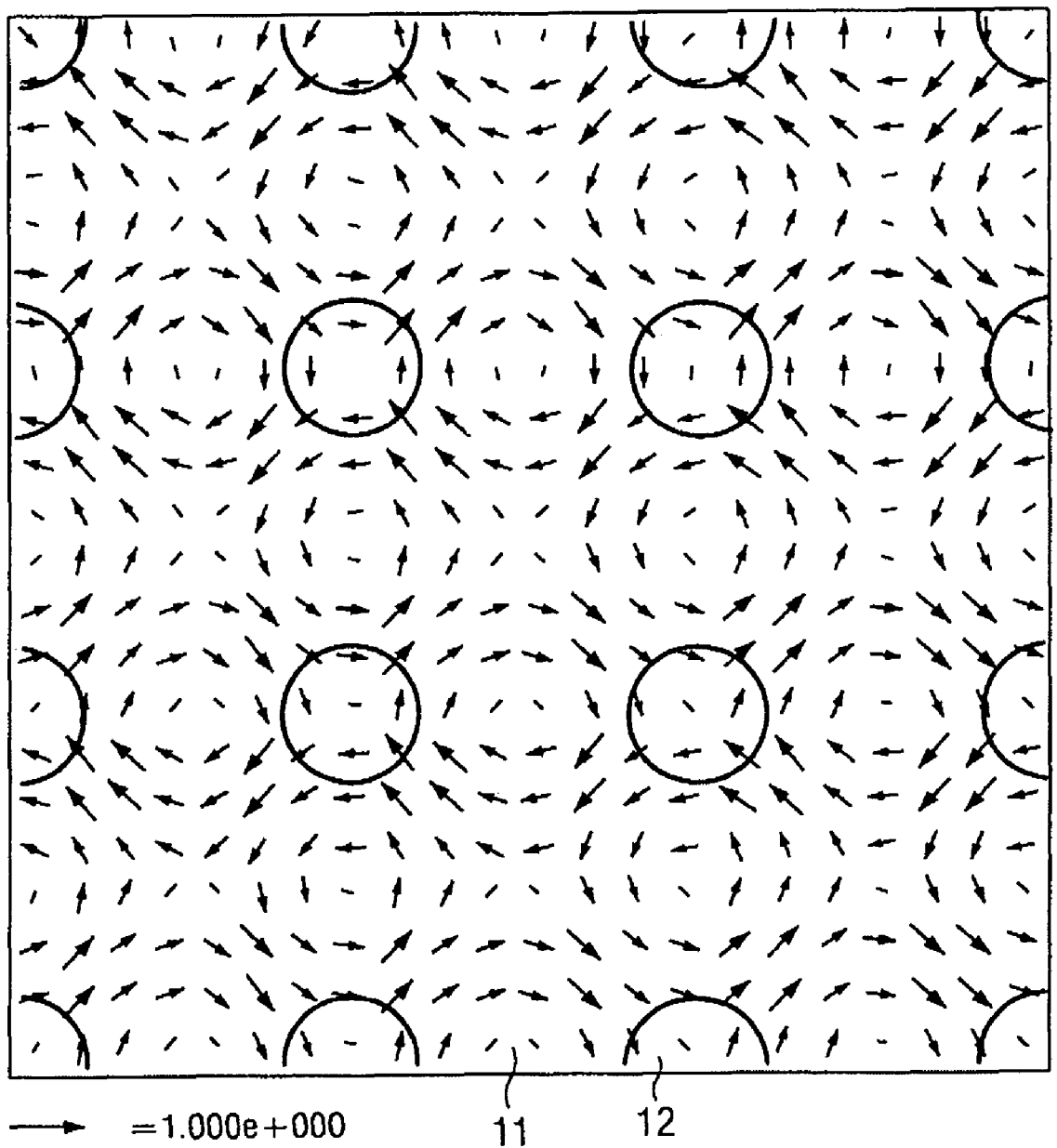
FIG. 39 is a diagram showing the electric field distribution in the near field pattern in the mode B of a conventional two-dimensional photonic crystal.
Figure 40:
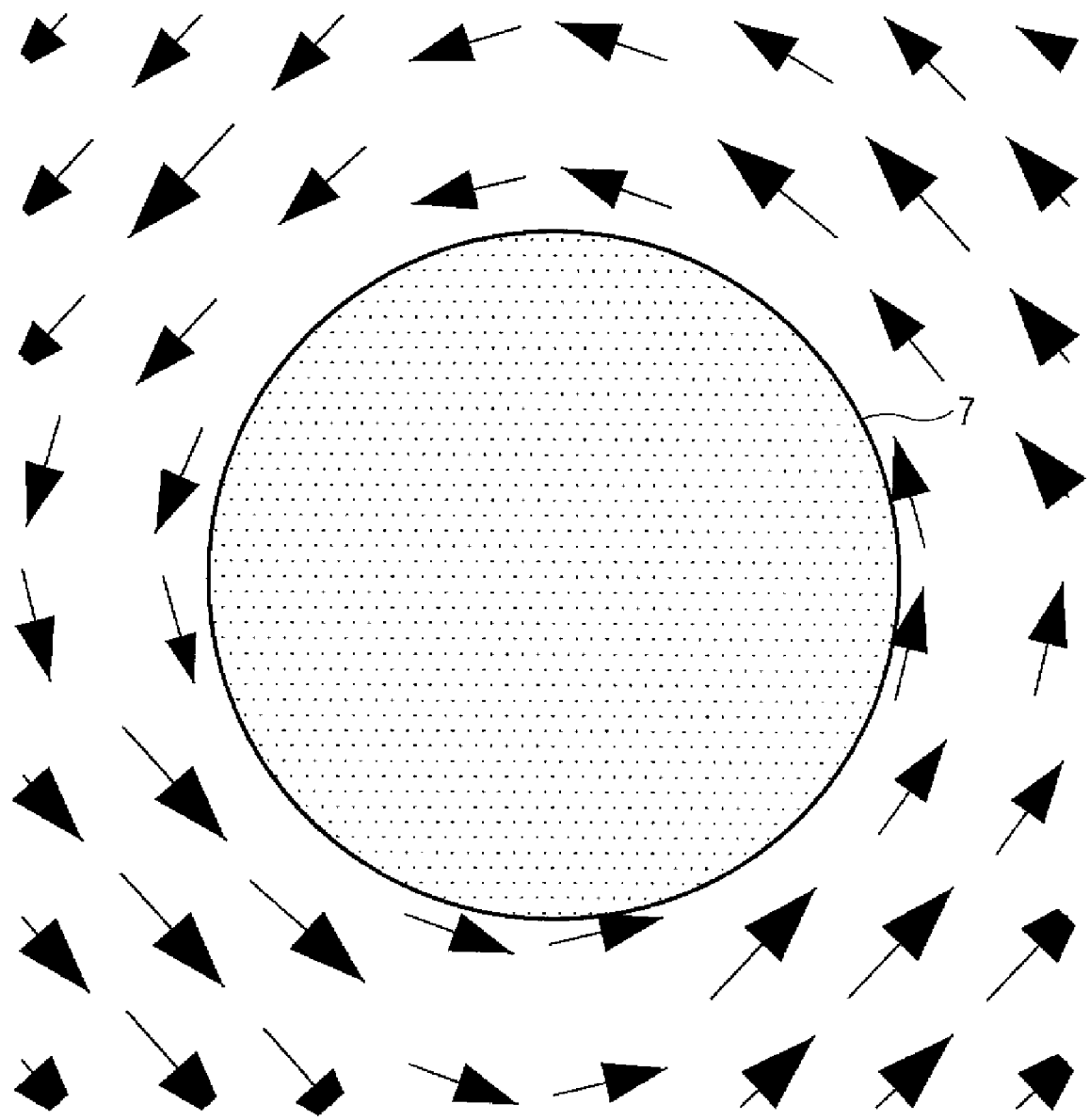
FIG. 40 is a diagram showing the electric field distribution in the far field pattern in the mode A of a conventional two-dimensional photonic crystal.
Figure 41:
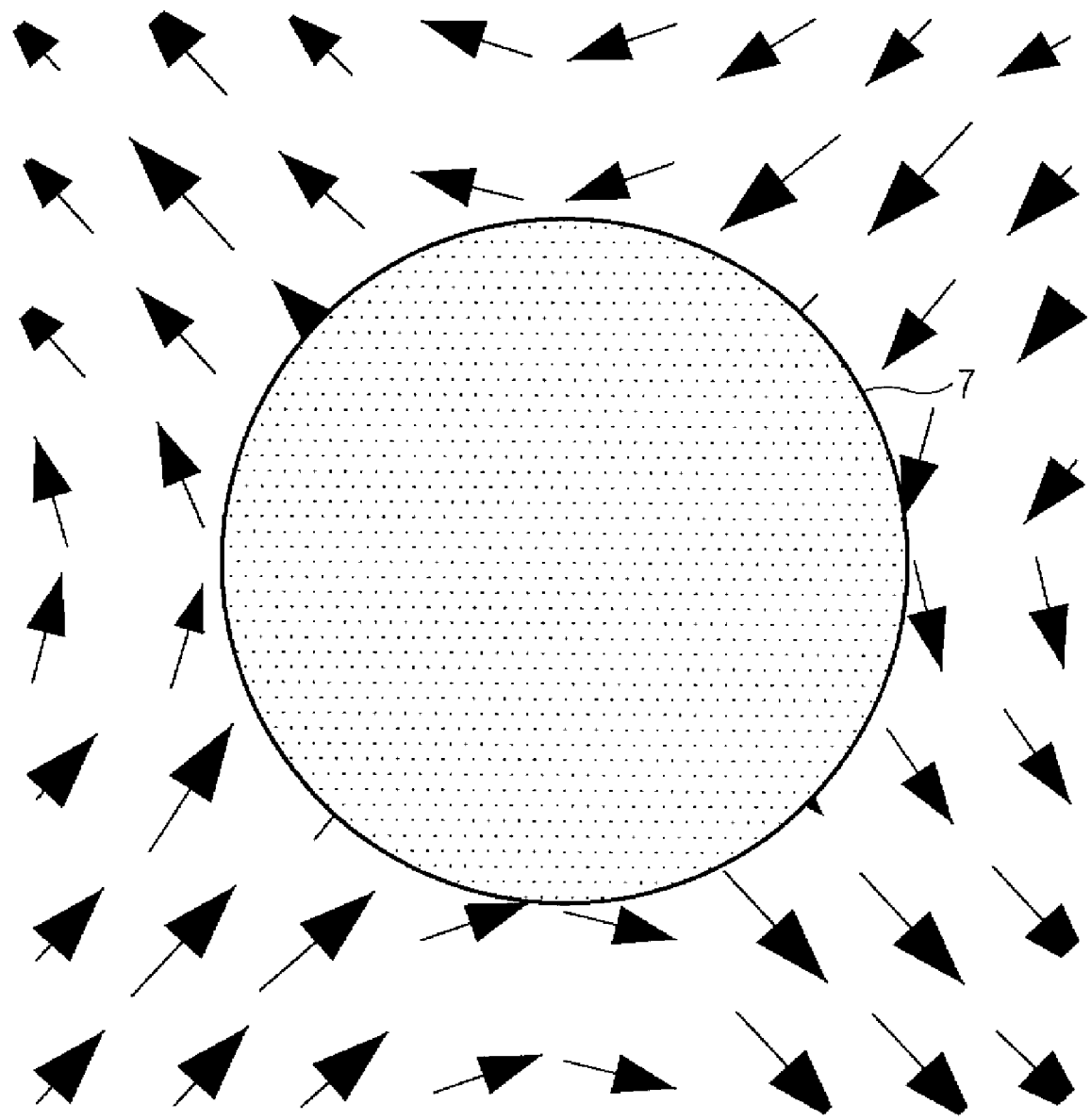
FIG. 41 is a diagram showing the electric field distribution in the far field pattern in the mode B of a conventional two-dimensional photonic crystal.

This figure shows that, provided that the refractive indices and sizes of the media and other parameters are appropriately set, the two-dimensional photonic crystal 10 has, at the second order Γ point, four different resonant frequencies and thus four different resonant modes corresponding to those resonant frequencies. That is, the modes C and D have different resonant frequencies, and thus mode degeneration as observed in the conventional two-dimensional photonic crystal shown in FIG. 37 is resolved.

Incidentally, mode degeneration in a two-dimensional photonic crystal can be resolved by distributing refractive indices asymmetrically with respect to at least one of the diagonal lines of the fundamental lattice E1. For example, within the fundamental lattice E1 shown in FIG. 2, instead of forming a patch of the third medium as indicated by 13a, one may be placed as indicated by 13b, i.e., on one diagonal line C2.

FIGS. 4 to 7 show the electric field distributions in the two-dimensional photonic crystal 10 when it is in the mode-A, mode-B, mode-C, and mode-D resonant states, respectively; that is, these figures show the near field pattern images at the time of laser oscillation. Arrows indicate the directions and magnitudes of electric fields. As shown in these figures, in all the modes, the directions of electric fields are uniform. That is, the polarization direction is uniform.

Figure 8:
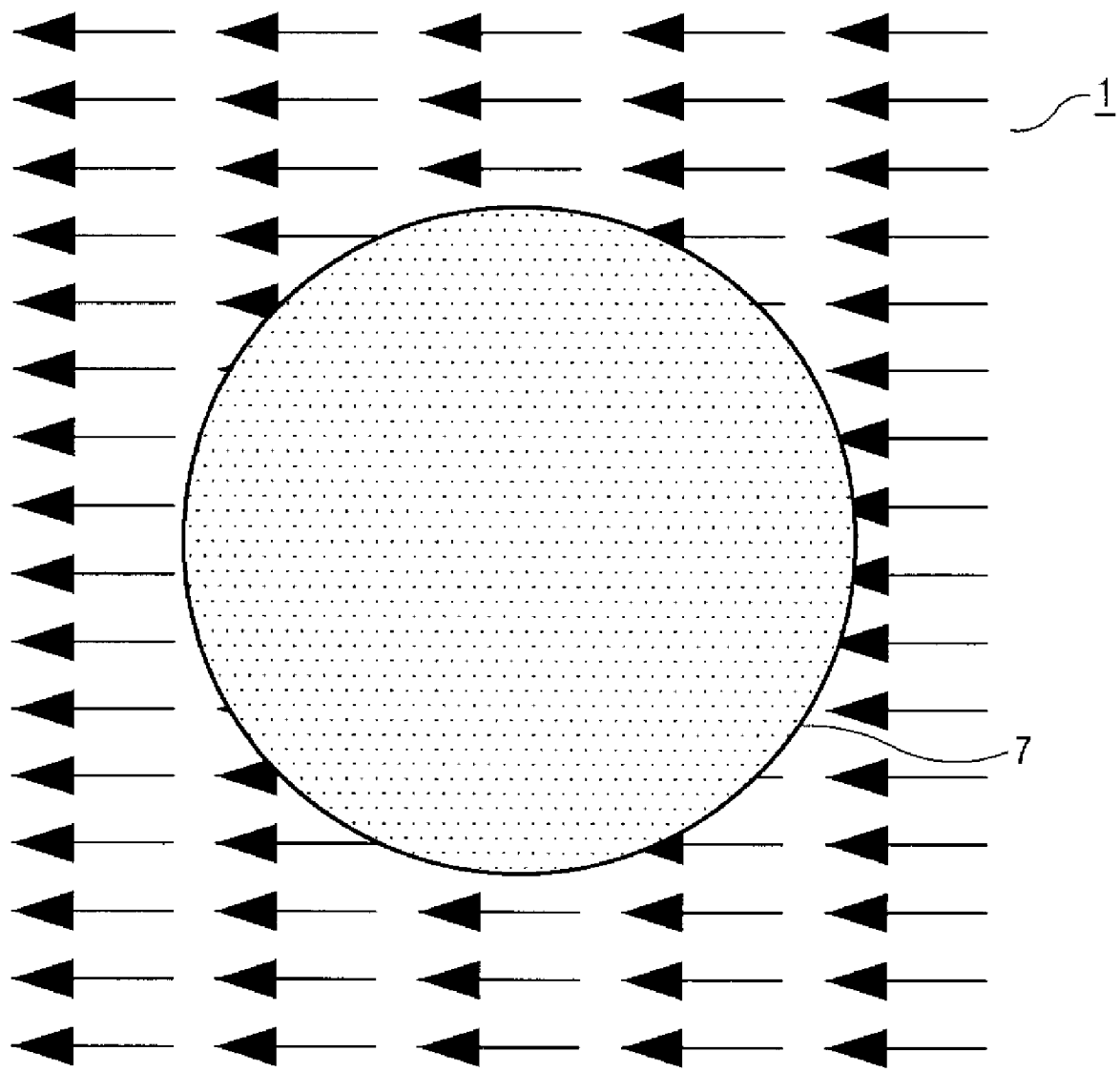
FIG. 8 is a diagram showing the electric field distribution in the far field pattern in the modes A and D of the two-dimensional photonic crystal of the first embodiment of the invention.
Figure 9:
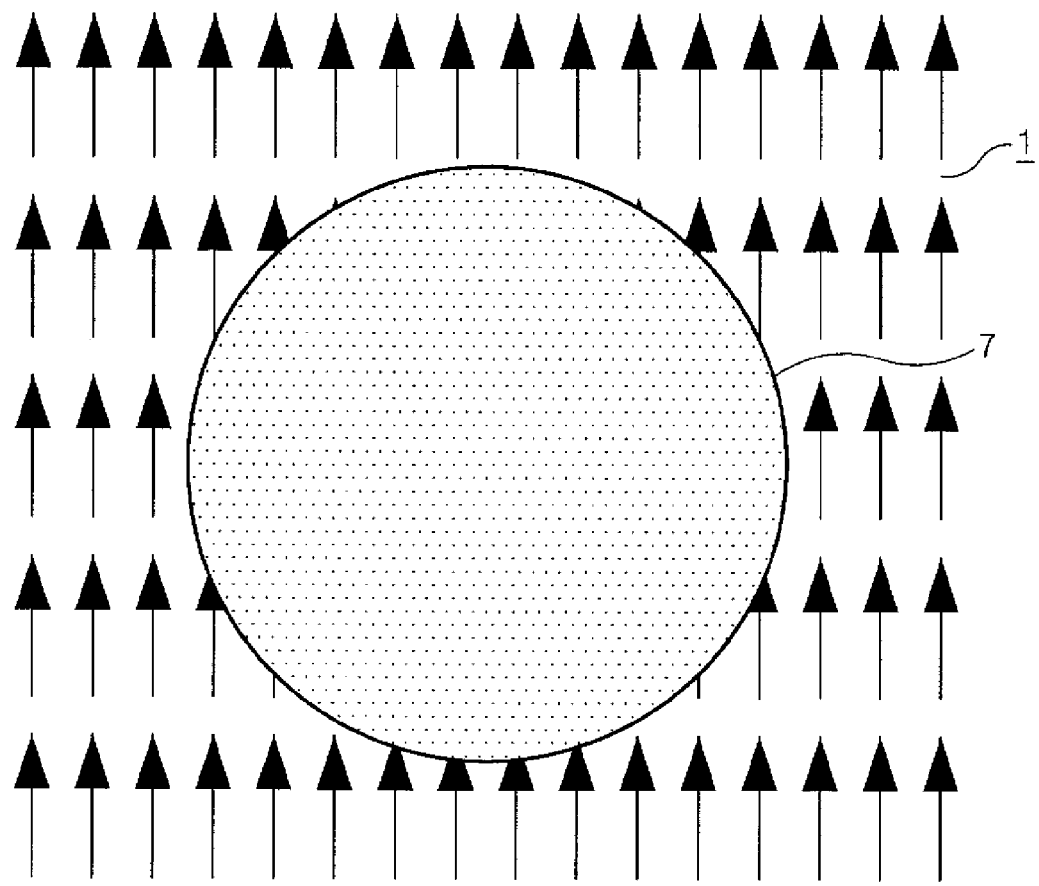
FIG. 9 is a diagram showing the electric field distribution in the far field pattern in the modes B and C of the two-dimensional photonic crystal of the first embodiment of the invention.

Accordingly, as shown in FIG. 8, which shows the electric field distribution in the far field pattern in the modes A and D, and in FIG. 9, which shows the electric field distribution in the far field pattern in the modes B and C, it is possible to obtain a two-dimensional photonic crystal surface-emitting laser 1 that emits light of which the polarization direction (the directions of electric fields) is uniform.

Incidentally, in the modes A and B, in a central portion of the light-emitting region, electric fields cancel out one another. As a result, the central portion of the light-emitting region covered with the electrodes 7 is a non-light-emitting region. Thus, light emission takes place in a ring-shaped region with a bright peripheral portion and a dim central portion. By contrast, in the modes C and D, electric fields do not cancel out one another, and thus light emission takes place all over the light-emitting region. Accordingly, two-dimensional photonic crystal surface-emitting lasers are better used in the modes C and D than in the modes A and B.

The third medium 13 has a different refractive index from the first medium 11, but may have the same refractive index as the second medium 12. To resolve mode degeneration, the third medium 13 may be arrayed at any positions, provided that it is arrayed asymmetrically with respect to at least one of the diagonal lines C1 and C2. The third medium 13 may be arrayed at random positions, but it is preferable to array it at positions as described below.

Figure 10:
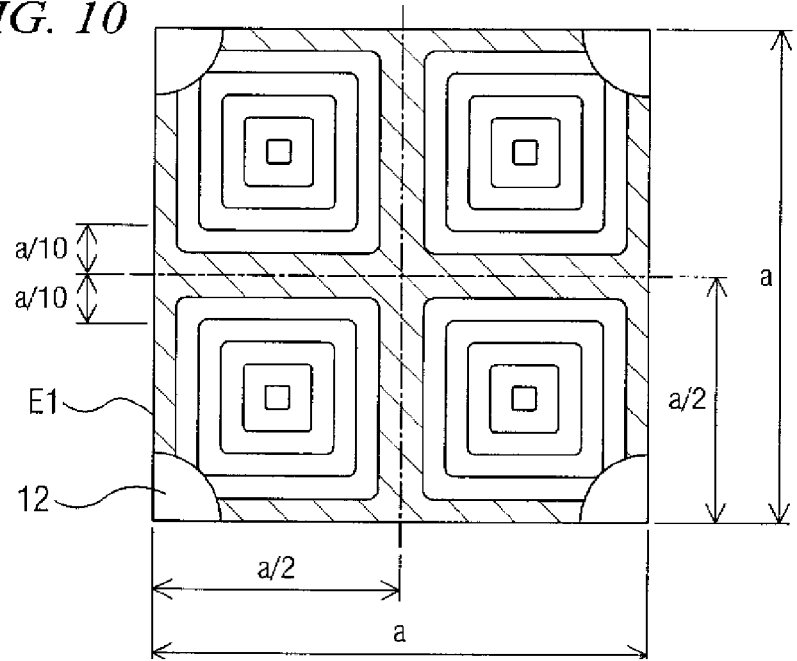
FIG. 10 is a diagram showing the diffracting effect obtained by appropriately positioning defects in the two-dimensional photonic crystal of the first embodiment of the invention.

FIG. 10 is a diagram showing, in the form of contour lines, the degree of how light is affected by the presence of the photonic crystal when the third medium 13 is arrayed within the fundamental lattice E1. Hatching indicates where the effect is great. This figure shows that arraying the third medium 13 on a side of the fundamental lattice E1 or on the bisecting normal to a side thereof is most effective, resulting in the presence of the photonic crystal exerting the greatest effect. Arraying the third medium 13 within a width of "0.1a" (=a/10) of a side of the fundamental lattice E1 or the bisecting normal to a side thereof produces a satisfactory effect.

Figure 11:
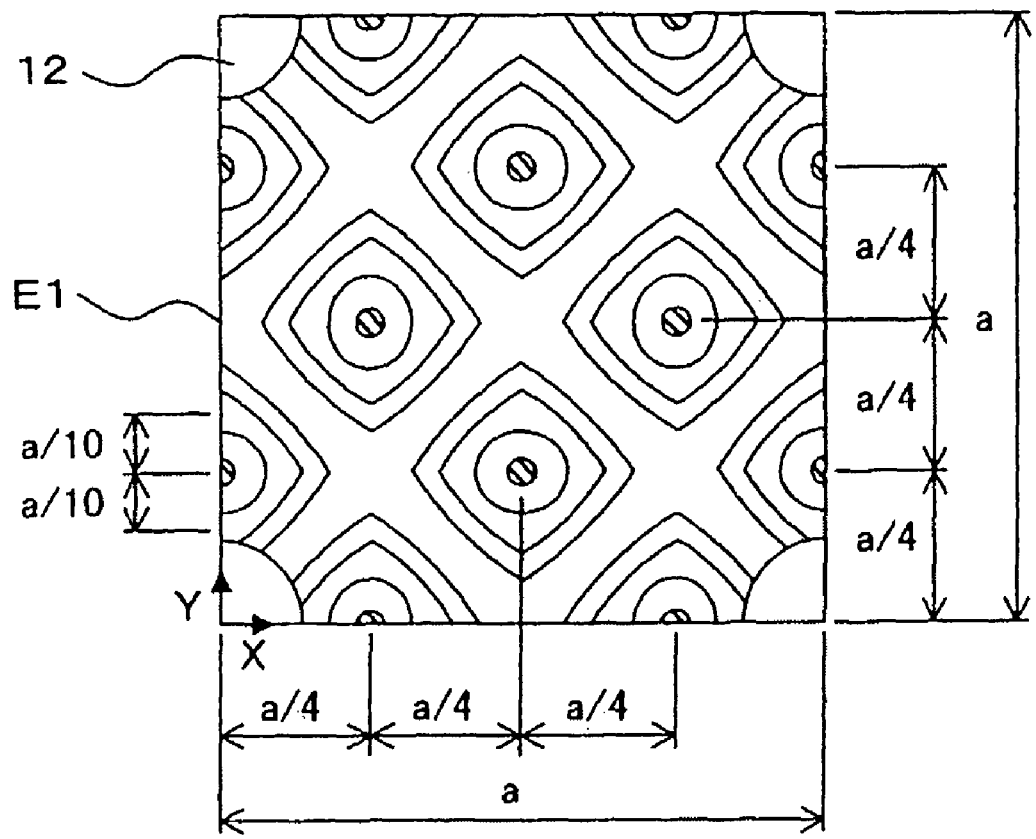
FIG. 11 is a diagram showing the effect of uniformizing the directions of electric fields obtained by appropriately positioning defects in the two-dimensional photonic crystal of the first embodiment of the invention.

FIG. 11 is a diagram showing, in the form of contour lines, how great is the effect of the third medium 13 making the differences between the frequencies of the different modes greater when the third medium 13 is arrayed within the fundamental lattice E1. Hatching indicates where the effect is great. This figure shows that, assuming that two adjacent sides of the fundamental lattice E1 are the X- and Y-axes with the origin set at the position of a patch of the second medium 12, arraying the third medium 13 at points of which the X- and Y-coordinates are (na/4, ma/4), where n=0, 2, and 4, and m=1 and 3 or (na/4, ma/4), where n 1 and 3, and m=0, 2, and 4.

is most effective in making the differences between the frequencies of the different modes greater. Arraying the third medium 13 within a radius of "0.1a" (=a/10) of such a point produces a satisfactory effect.

For example, when the third medium 13 is arrayed at positions of which the X- and Y-coordinates are (0, a/4), (0, 3a/4), and (a/4, a/2), light is satisfactorily affected by the photonic crystal, resulting in a great effect of the photonic crystal and large differences between the frequencies of the different modes.

Figure 12:
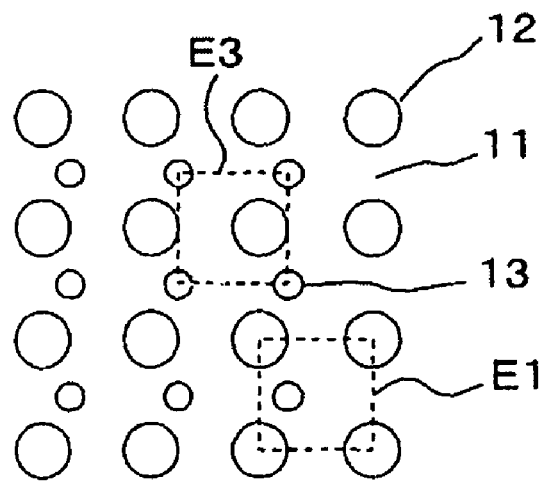
FIG. 12 is a plan view of the two-dimensional photonic crystal of a second embodiment of the invention.
Figure 13:
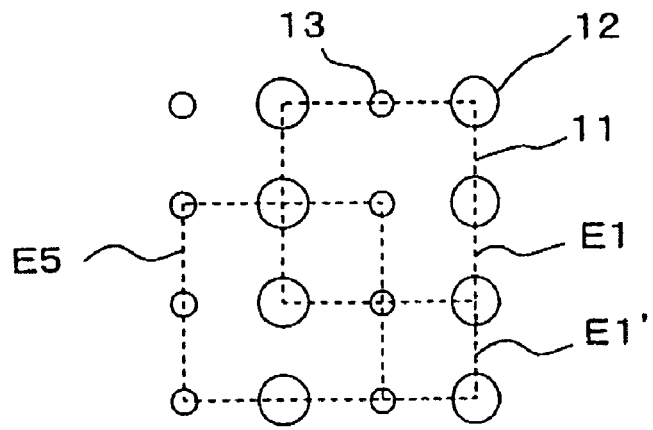
FIG. 13 is a plan view of the two-dimensional photonic crystal of a third embodiment of the invention.

As in a second embodiment of the invention shown in FIG. 12, patches of the third medium 13 may be arrayed every period in two mutually perpendicular directions. In that case, even if a lattice section E3 is regarded as the fundamental lattice, patches of the third medium 13 is arrayed asymmetrically with respect to the two diagonal lines. As in a third embodiment of the invention shown in FIG. 13, within a fundamental lattice E1' having patches of the second medium 12 periodically arrayed, the two patches located at non-diagonal positions may be replaced with patches of the third medium 13. The resulting fundamental lattice E1 has a shorter side length than the original fundamental lattice E1', and is asymmetric with respect to the diagonal lines. The same holds even if a lattice section E5 having its vertices at patches of the third medium 13 is regarded as the fundamental lattice.

In the first to third embodiments, as compared with arraying the third medium 13 with a long period of the second medium 12, arraying the third medium 13 with a short period of the second medium 12 produces a greater effect of resolving mode degeneration and making the differences between the different resonant frequencies greater. This permits easier selection of the resonance mode used. Moreover, as compared with making patches of the third medium 13 small, making them large results in a greater effect of resolving mode degeneration.

Figure 14:
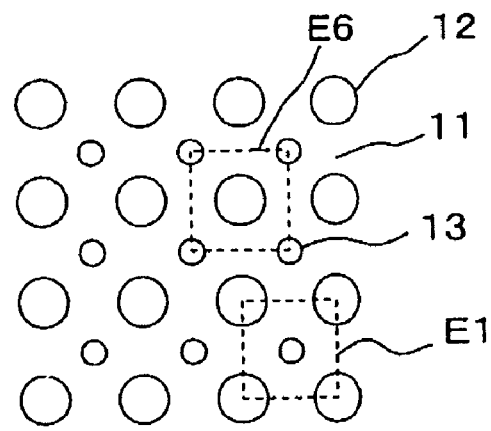
FIG. 14 is a plan view illustrating the symmetry obtained by appropriately positioning defects in a two-dimensional photonic crystal.

In FIGS. 14 to 17, the refractive index distribution is symmetrical with respect to both the diagonal lines of the fundamental lattice. As shown in FIG. 14, in a case where patches of the third medium 13 are arrayed at midpoints of the diagonal lines of the fundamental lattice E1, the refractive index distribution is symmetric with respect to both the diagonal lines of the fundamental lattice E1. This makes it impossible to make the polarization direction of the emitted light uniform. The same holds even if a lattice section E6 having its vertices at patches of the third medium 13 is regarded as the fundamental lattice.

Figure 15:
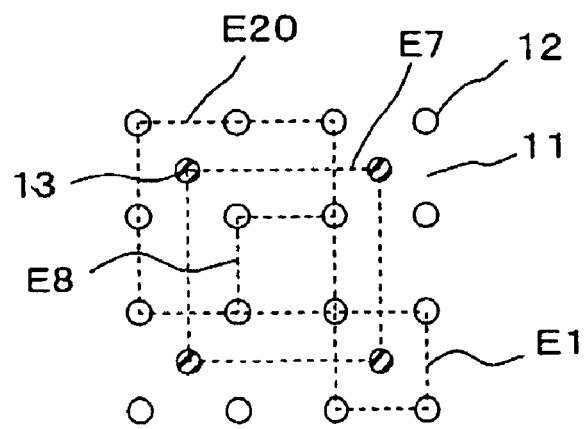
FIG. 15 is a plan view illustrating the symmetry obtained by appropriately arraying defects in a two-dimensional photonic crystal.

Likewise, as shown in FIG. 15, in a case where patches of the third medium 13 are arrayed at midpoints of the diagonal lines of the fundamental lattice E1 every two periods thereof, the refractive index distribution is symmetric with respect to both the diagonal lines of the fundamental lattice E1. The same holds even if a lattice section E7 or E8 is regarded as the fundamental lattice. Incidentally, here, a lattice section E20 has its vertices at patches of the second medium 12, but its side length is not equal to the minimum period of the second medium 12, and therefore the lattice section E20 cannot be regarded as a fundamental lattice.

Figure 16:
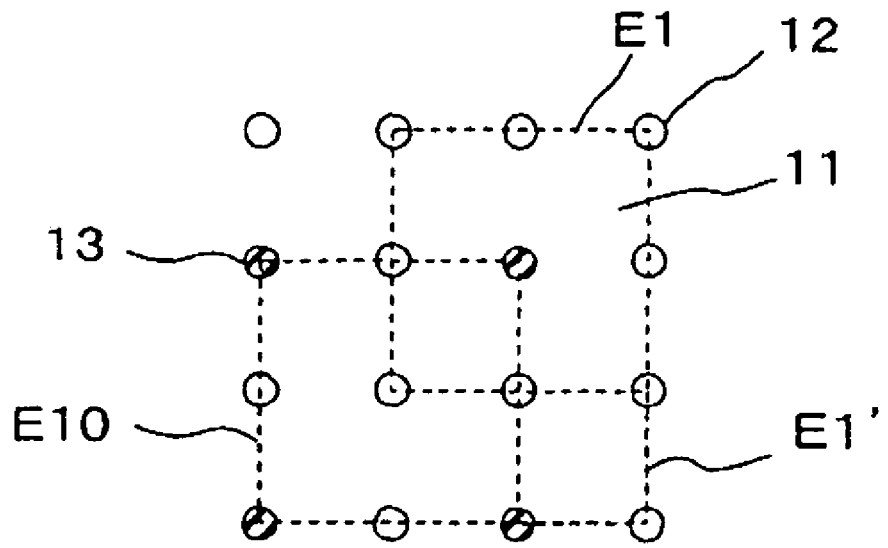
FIG. 16 is a plan view illustrating the symmetry obtained by appropriately arraying defects in a two-dimensional photonic crystal.

Likewise, as shown in FIG. 16, in a case where, within a fundamental lattice E1' having patches of the second medium 12 periodically arrayed, one patch is replaced with a patch of the third medium 13 every one period, the refractive index distribution is symmetric with respect to both the diagonal lines of the new fundamental lattice E1. The same holds even if a lattice section E10 is regarded as the fundamental lattice.

Figure 17:
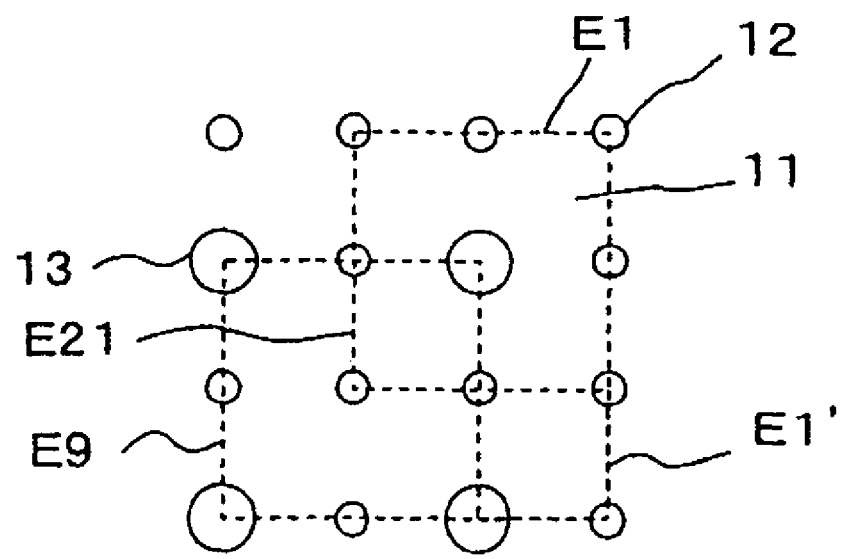
FIG. 17 is a plan view illustrating the symmetry obtained by appropriately arraying defects in a two-dimensional photonic crystal.

Likewise, as shown in FIG. 17, in a case where, within a fundamental lattice E1' having patches of the second medium 12 periodically arrayed, one patch is replaced with a patch of the third medium 13, formed of the same material but in a different size, every two period, the refractive index distribution is symmetric with respect to both the diagonal lines of the new fundamental lattice E1. The same holds even if a lattice section E9 is regarded as the fundamental lattice. Incidentally, here, a lattice section E21 has its vertices at patches of the second and third media 12 and 13, which are of the same material, but those patches have different sizes, and therefore the lattice section E21 cannot be regarded as a fundamental lattice.

Figure 18:
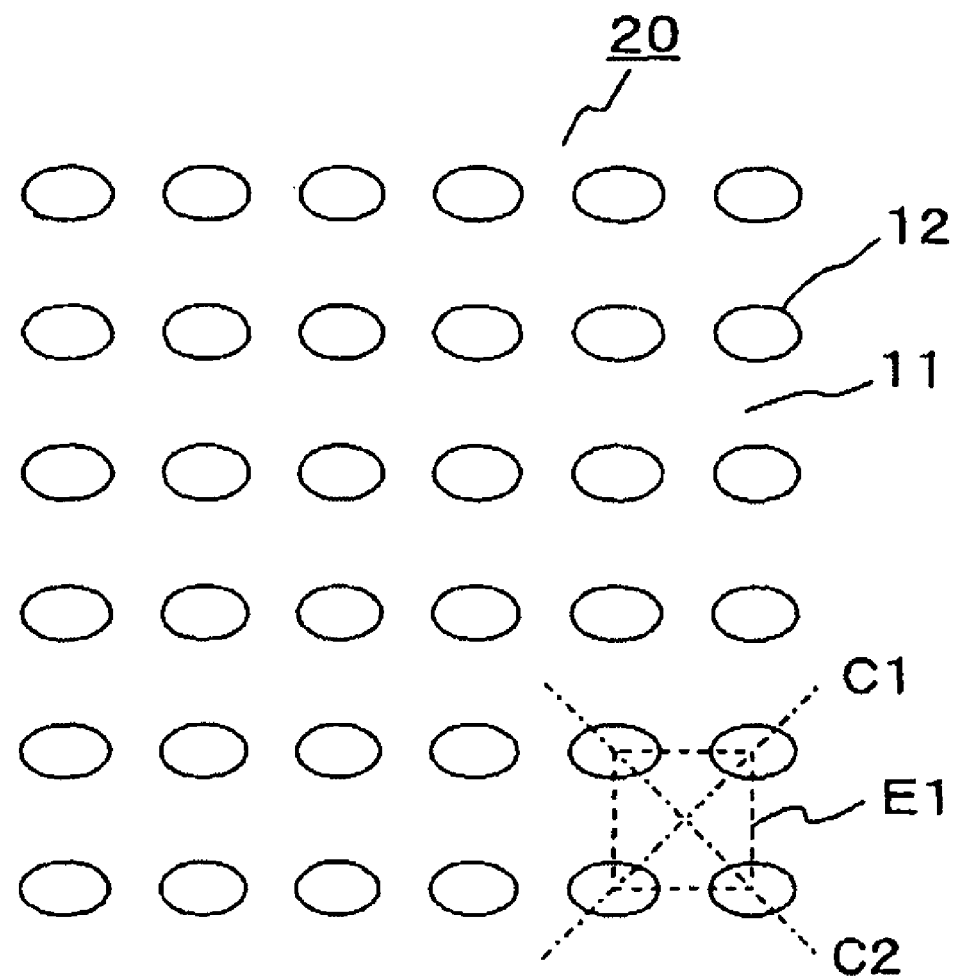
FIG. 18 is a plan view of the two-dimensional photonic crystal of a fourth embodiment of the invention.

FIG. 18 is a plan view of the two-dimensional photonic crystal incorporated in the two-dimensional photonic crystal surface-emitting laser of a fourth embodiment of the invention. The two-dimensional photonic crystal 20 of this embodiment has a second medium 12 in the form of patches having an elliptic cross-sectional shape formed with equal periods in two mutually perpendicular directions in a first medium 11. In other respects, the structure here is the same as that of the first embodiment.

In this embodiment, the first and second media 11 and 12 have different refractive indices, and therefore the refractive index distribution is asymmetric with respect to both the diagonal lines C1 and C2 of the fundamental lattice E1, which has the shape of a square having its vertices at patches of the second medium 12.

Figure 19:
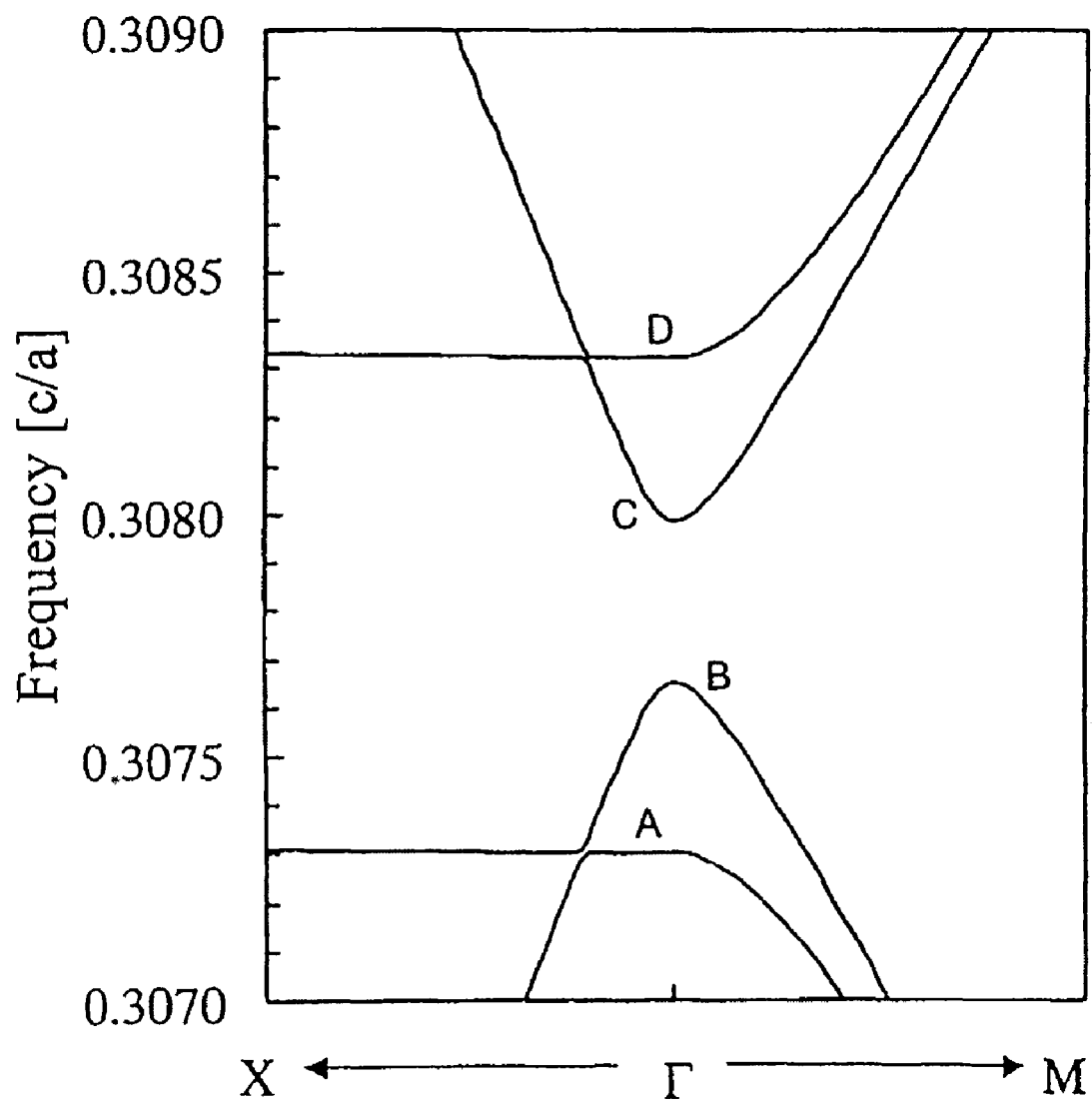
FIG. 19 is a band diagram of the second order Γ point of the two-dimensional photonic crystal of the fourth embodiment of the invention.
Figure 20:
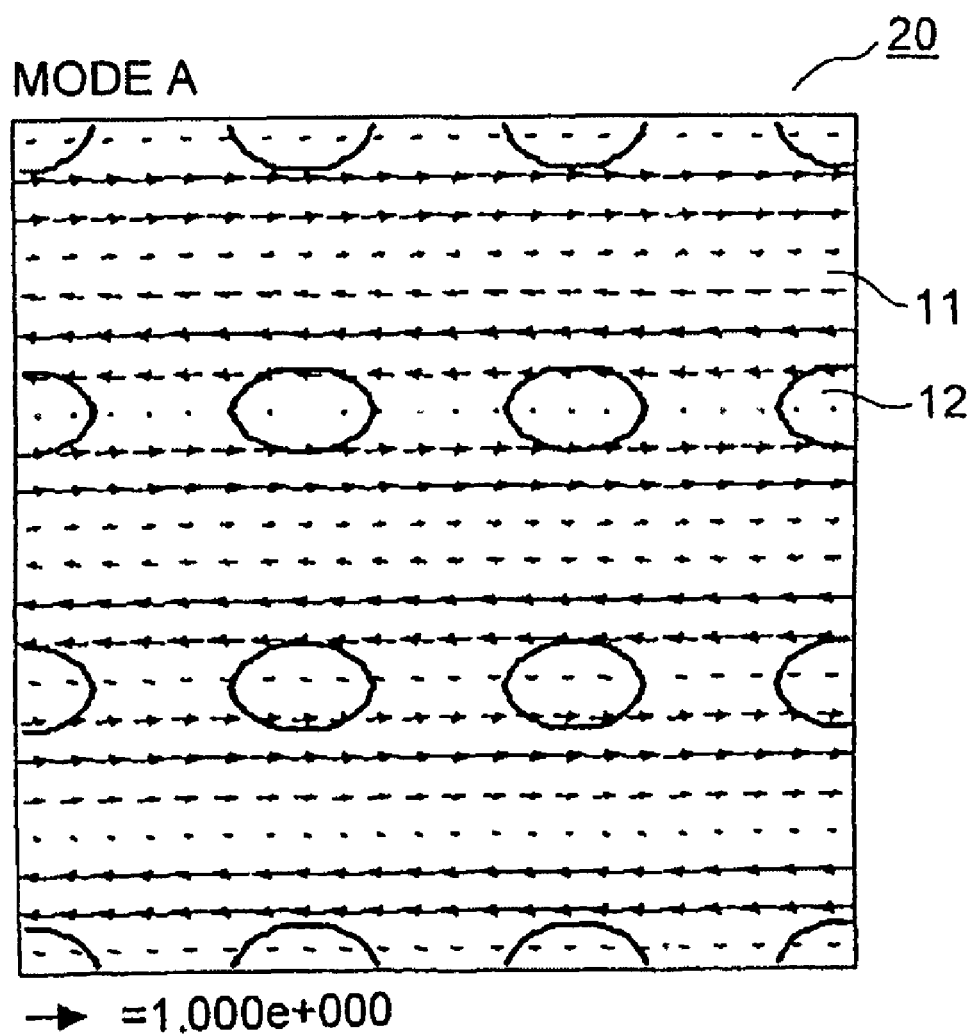
FIG. 20 is a diagram showing the electric field distribution in the near field pattern in the mode A of the two-dimensional photonic crystal of the fourth embodiment of the invention.
Figure 21:
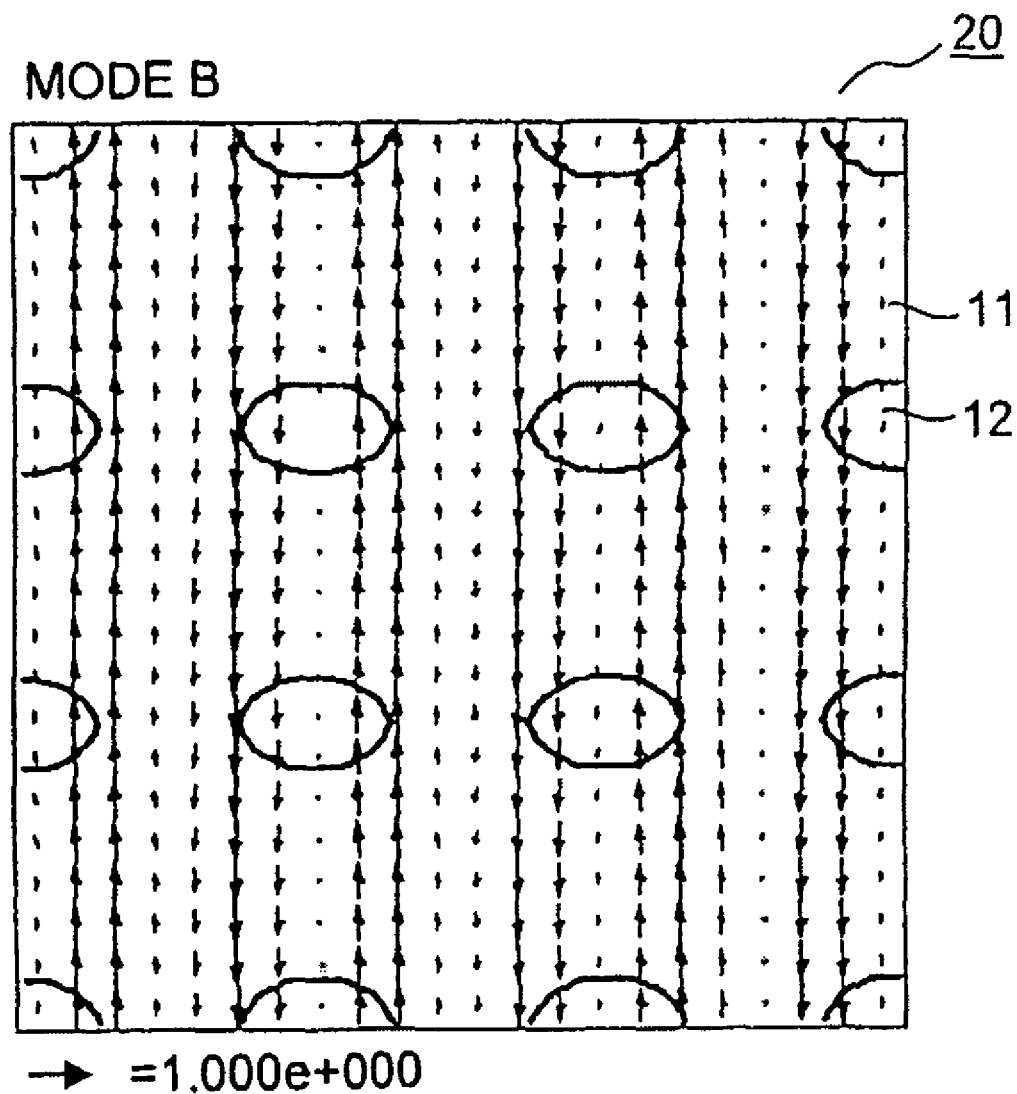
FIG. 21 is a diagram showing the electric field distribution in the near field pattern in the mode B of the two-dimensional photonic crystal of the fourth embodiment of the invention.
Figure 22:
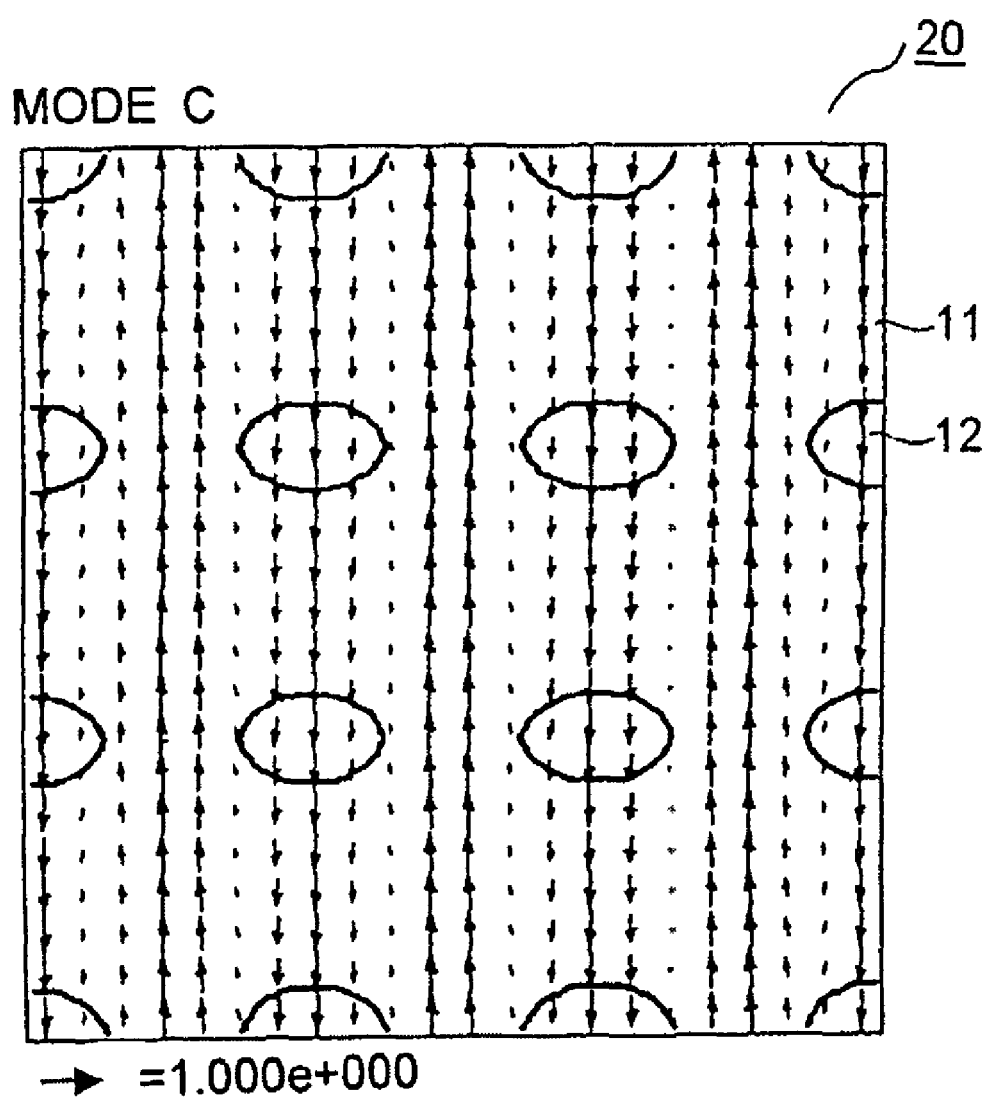
FIG. 22 is a diagram showing the electric field distribution in the near field pattern in the mode C of the two-dimensional photonic crystal of the fourth embodiment of the invention.
Figure 23:
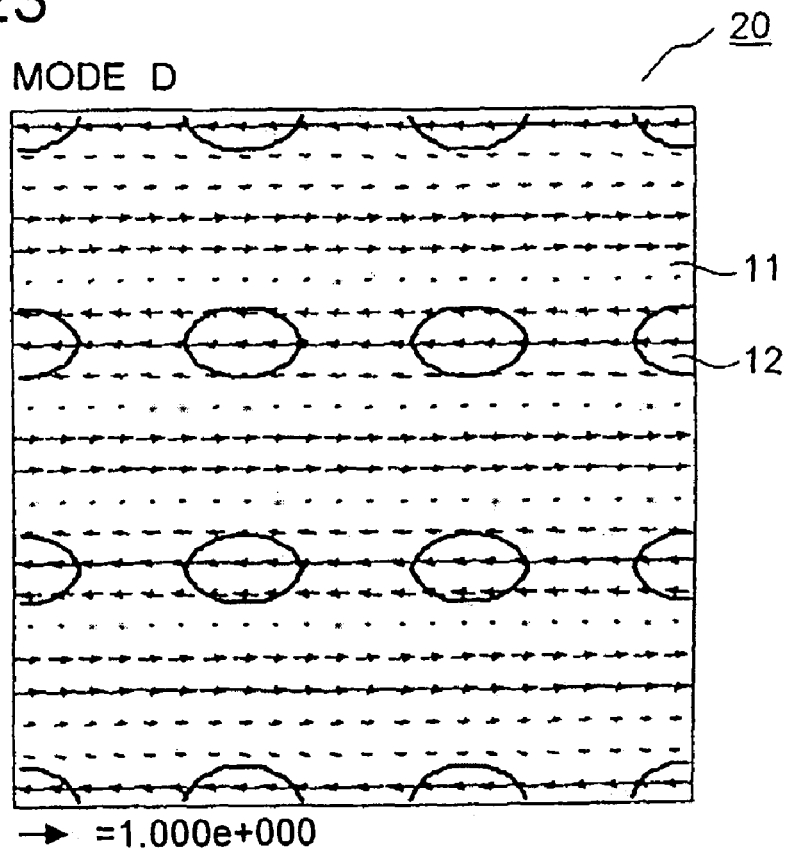
FIG. 23 is a diagram showing the electric field distribution in the near field pattern in the mode D of the two-dimensional photonic crystal of the fourth embodiment of the invention.

FIG. 19 is a band diagram of the second order Γ point (see FIG. 36, the part S) of the two-dimensional photonic crystal 20 structured as described above. Along the vertical axis is taken the normalized frequency, i.e., the frequency of light normalized by being multiplied by "a/c," and along the horizontal axis is taken the wave-number vector of light. Provided that the refractive indices and sizes of the media and other parameters are appropriately set, the two-dimensional photonic crystal 20 has, at the second order Γ point, four different resonant frequencies and thus four different resonant modes corresponding to those resonant frequencies. That is, the modes C and D have different resonant frequencies, and thus, in the two-dimensional photonic crystal 20, mode degeneration is resolved.

FIGS. 20 to 23 show the electric field distributions in the two-dimensional photonic crystal 20 when it is in the mode-A, mode-B, mode-C, and mode-D resonant states, respectively; that is, these figures show the near field pattern images at the time of laser oscillation. Arrows indicate the directions and magnitudes of electric fields. As shown in these figures, in all the modes, the directions of electric fields are uniform. That is, the polarization direction is uniform. This makes it possible to obtain a two-dimensional photonic crystal surface-emitting laser 1 that emits light of which the polarization direction (the directions of electric fields) is uniform.

Figure 24:
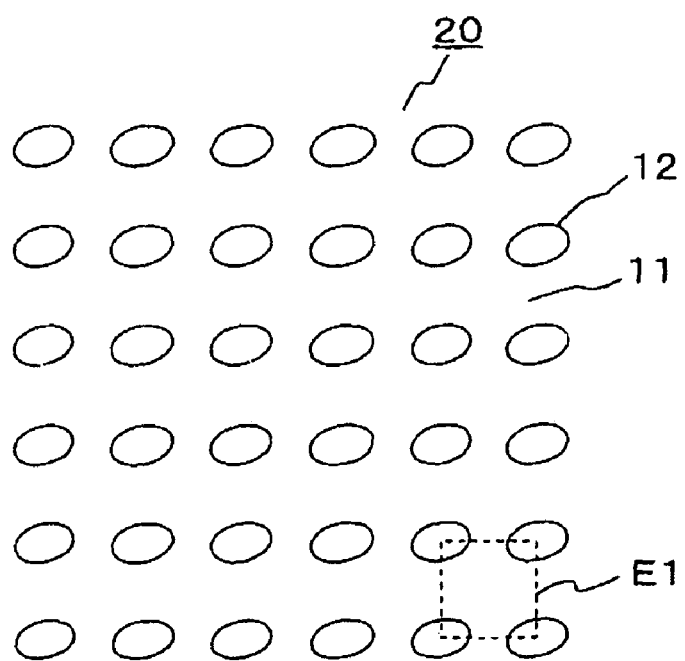
FIG. 24 is a plan view of the two-dimensional photonic crystal of a fifth embodiment of the invention.
Figure 25:
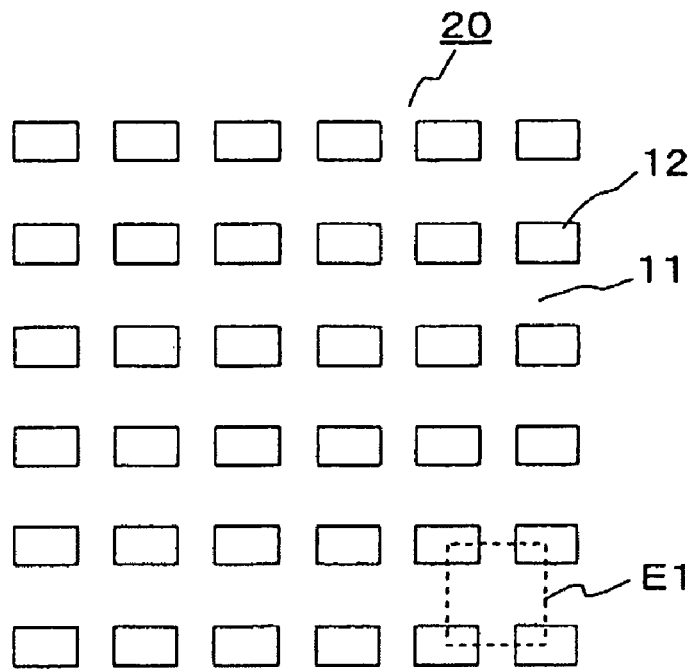
FIG. 25 is a plan view of the two-dimensional photonic crystal of a sixth embodiment of the invention.

As in a fifth embodiment of the invention shown in FIG. 24, the patches of the second medium 12, each having an elliptic cross-sectional shape, may be arrayed with an inclination relative to the directions of the period. As in a sixth embodiment of the invention shown in FIG. 25, giving the patches of the second medium 12 a rectangular cross-sectional shape results in obtaining the same effect.

Figure 26:
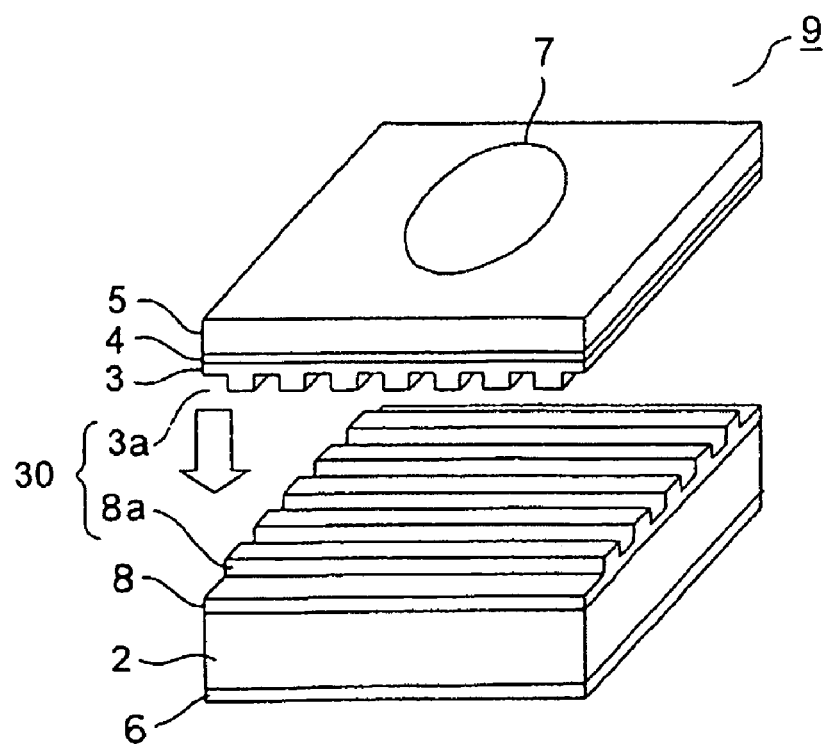
FIG. 26 is an exploded perspective view of the two-dimensional photonic crystal surface-emitting laser of a seventh embodiment of the invention.

FIG. 26 is an exploded perspective view of the two-dimensional photonic crystal surface-emitting laser of a seventh embodiment of the invention. For convenience' sake, in the following descriptions, such elements as find their counterparts in the first embodiment shown in FIG. 1 and described earlier are identified with the same reference numerals. The two-dimensional photonic crystal surface-emitting laser 9 has lower clad layers 3 and 8, an active layer 4, and an upper clad layer 5 laid on top of a substrate 2. These are formed of the same materials and in the same manners as in the first embodiment. The lower clad layers 3 and 8 may be formed of the same material or different materials. On the bottom surface of the substrate 2 and on the top surface of the upper clad layer 5, there are formed electrodes 6 and 7 of gold or the like.

On the top surface of the lower clad layer 8 and on the bottom surface of the upper clad layer 3, there are formed one-dimensional diffraction gratings 8a and 3a, respectively, that have grooves formed therein with the same one-dimensional period. The one-dimensional diffraction gratings 8a and 3a are cemented together in such a way that the directions of their periods are perpendicular to each other. In this way, a two-dimensional photonic crystal 30 having a two-dimensional periodic structure is formed.

Figure 27:
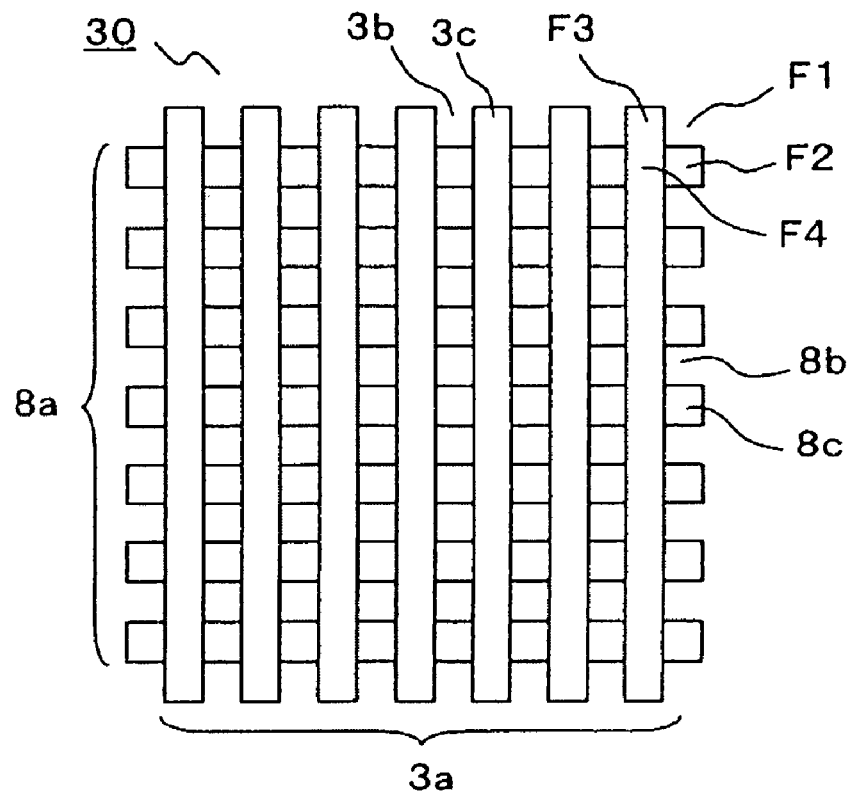
FIG. 27 is a plan view of the two-dimensional photonic crystal of the seventh embodiment of the invention.

FIG. 27 is a plan view of the two-dimensional photonic crystal 30. The one-dimensional diffraction gratings 8a and 3a have groove portions 8b and 3b and ridge portions 8c and 3c, respectively. The portions F1 where the groove portions 8b overlap the groove portions 3b have the same refractive index as air. The portions F2 where the ridge portions 8c overlap the groove portions 3b have the average refractive index between the refractive index of the lower clad layer 8 and that of air. The portions F3 where the groove portions 8b overlap the ridge portions 3c have the average refractive index between the refractive index of the lower clad layer 3 and that of air. The portions F4 where the ridge portions 8c overlap the ridge portions 3c have the average refractive index between the refractive index of the lower clad layer 8 and that of the lower clad layer 3.

The distance from the active layer 4 to the one-dimensional diffraction grating 3a is shorter than the distance from the active layer 4 to the one-dimensional diffraction grating 8a. Thus, the intensity of the light reaching the one-dimensional diffraction grating 3a is higher than that of the light reaching the one-dimensional diffraction grating 8a. Accordingly, the average refractive index of the portions F3 is affected more by the refractive index of the lower clad layer 3 than by the refractive index of air, and the average refractive index of the portions F2 is affected more by the refractive index of air than by the refractive index of the lower clad layer 8. Thus, even though the lower clad layers 8 and 3 have the same refractive index, the portions F2 and the portions F3 have different refractive indices.

Figure 28:
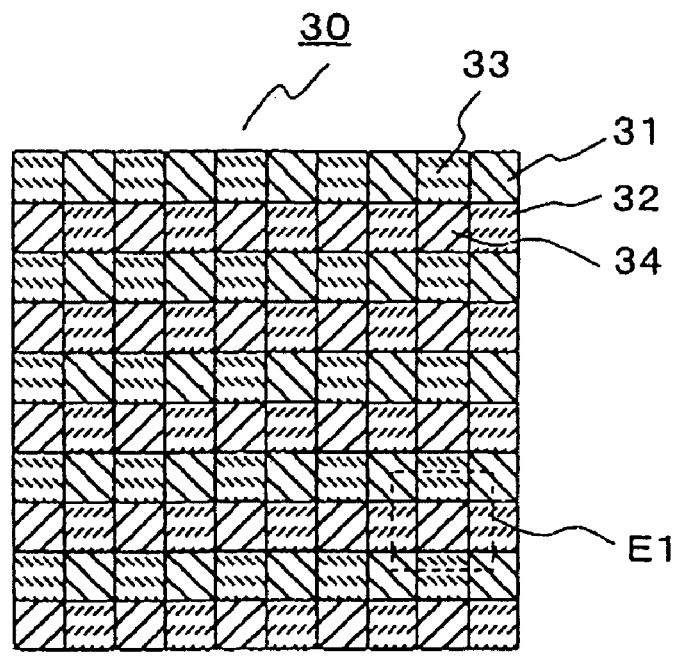
FIG. 28 is a plan view of the two-dimensional photonic crystal of the seventh embodiment of the invention.

As a result, as shown in FIG. 28, the two-dimensional photonic crystal 30 has a first, a second, a third, and a fourth medium 31, 32, 33, and 34 in the form of blocks having different refractive indices and having a rectangular cross-sectional shape arrayed in close contact with one another in a checkered pattern. Thus, for example, blocks of the first medium 31 are arrayed periodically in two mutually perpendicular directions, and therefore the two-dimensional photonic crystal 30 is formed as a square lattice. Moreover, the fundamental lattice E1, which has the shape of a square having its vertices at blocks of the first medium 31, exhibits a refractive index distribution that is asymmetric with respect to both of the two diagonal lines of the fundamental lattice E1.

Figure 29:
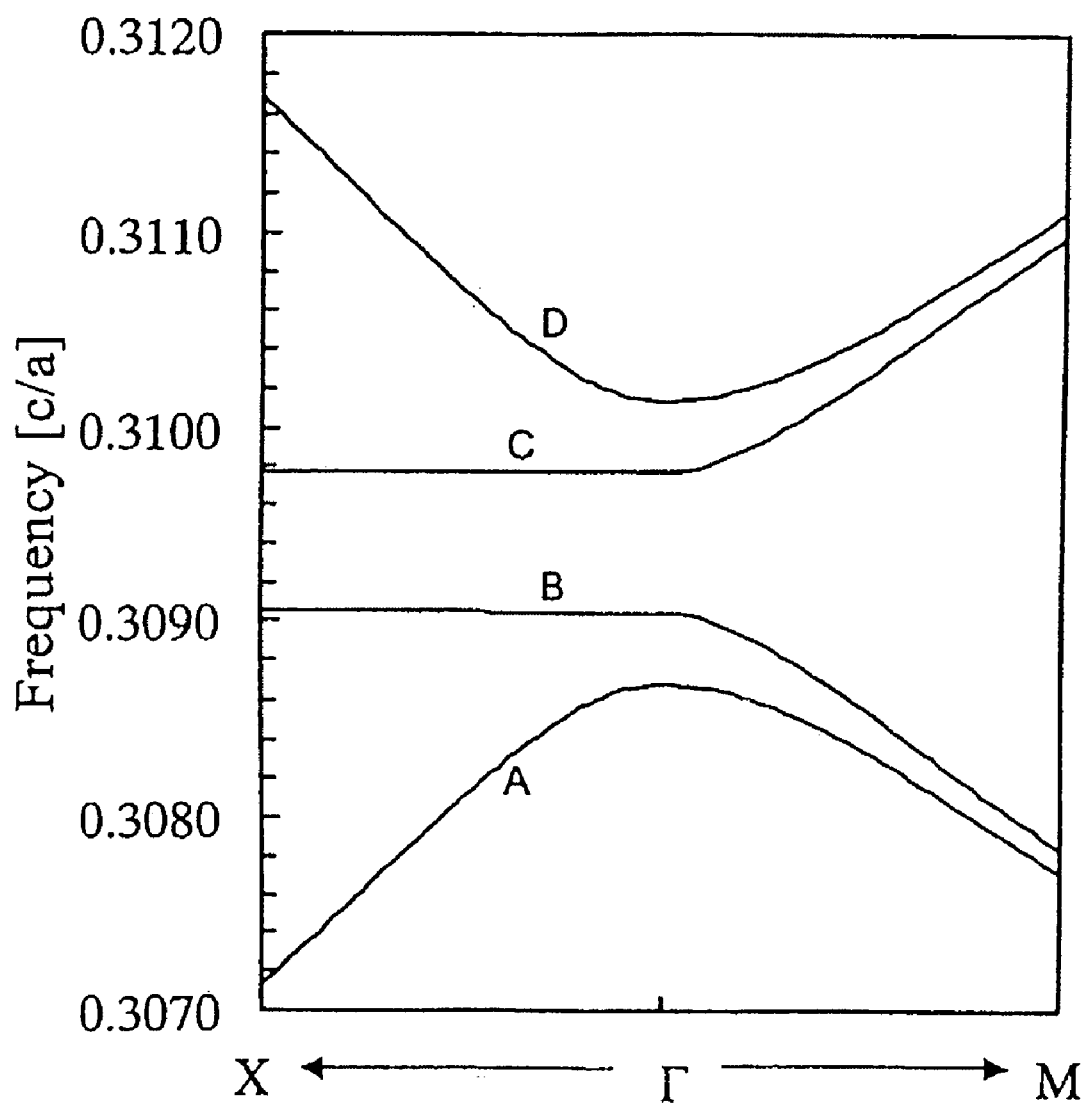
FIG. 29 is a band diagram of the second order Γ point of the two-dimensional photonic crystal of the seventh embodiment of the invention.
Figure 30:
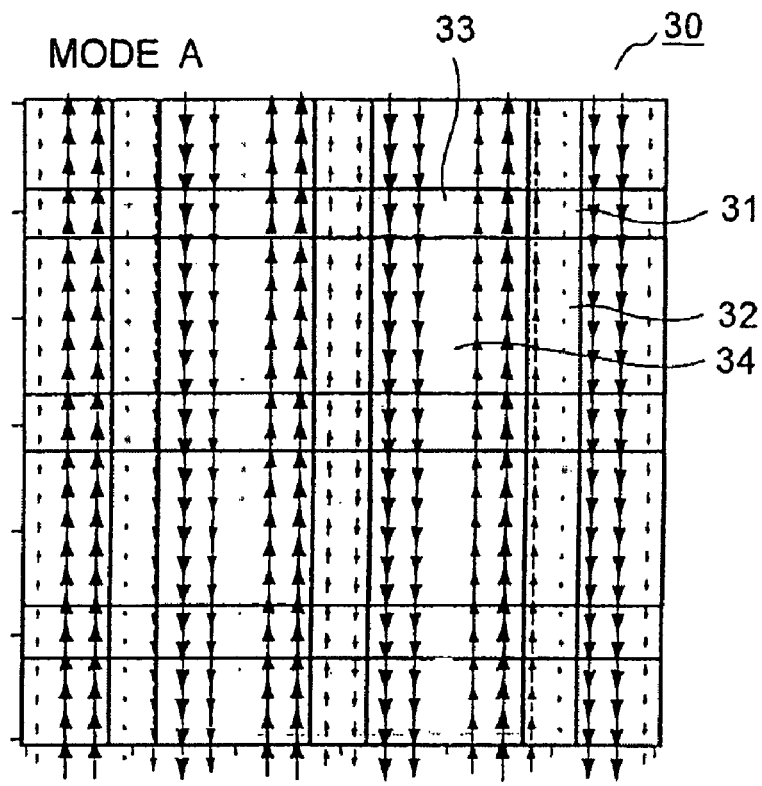
FIG. 30 is a diagram showing the electric field distribution in the near field pattern in the mode A of the two-dimensional photonic crystal of the seventh embodiment of the invention.
Figure 31:
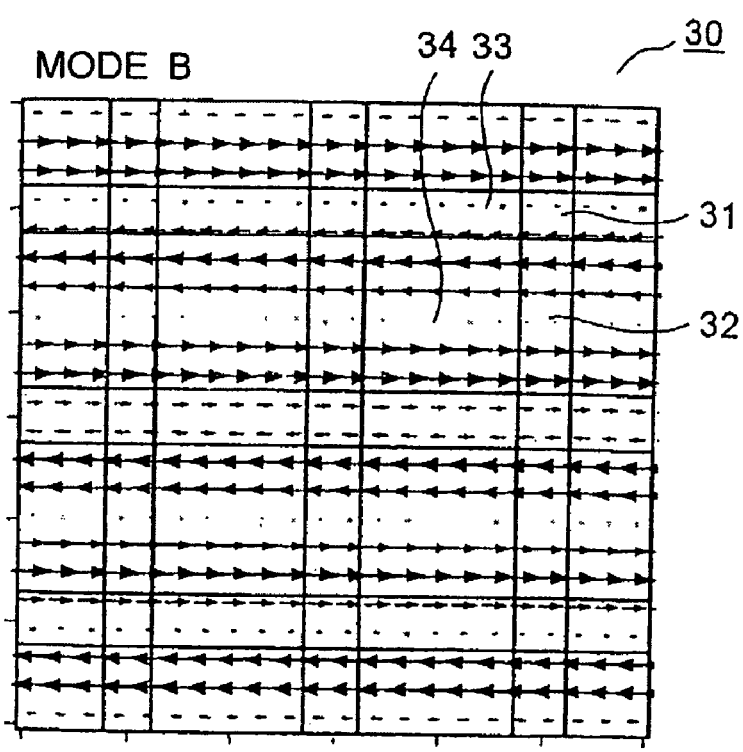
FIG. 31 is a diagram showing the electric field distribution in the near field pattern in the mode B of the two-dimensional photonic crystal of the seventh embodiment of the invention.
Figure 32:
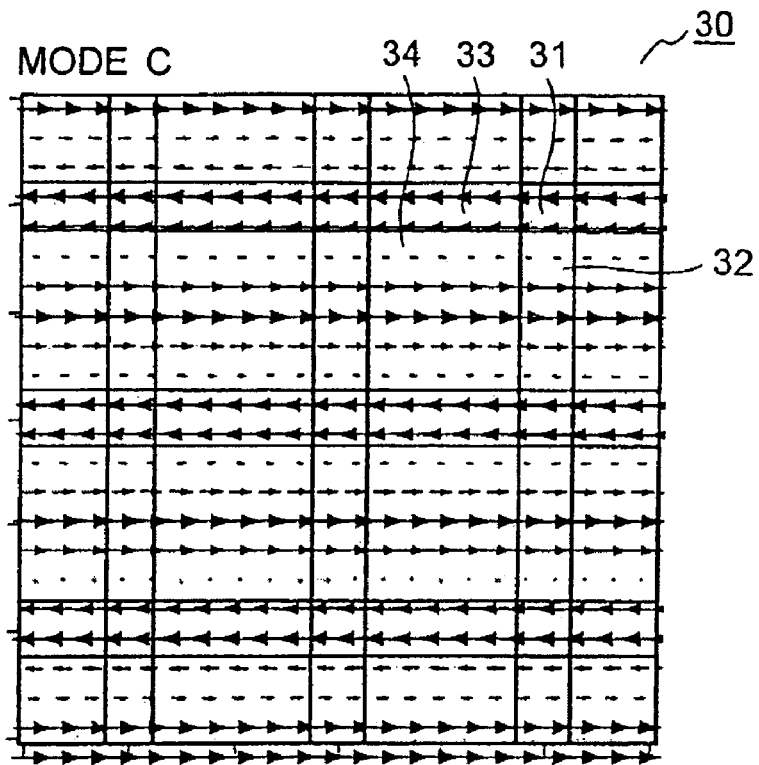
FIG. 32 is a diagram showing the electric field distribution in the near field pattern in the mode C of the two-dimensional photonic crystal of the seventh embodiment of the invention.
Figure 33:
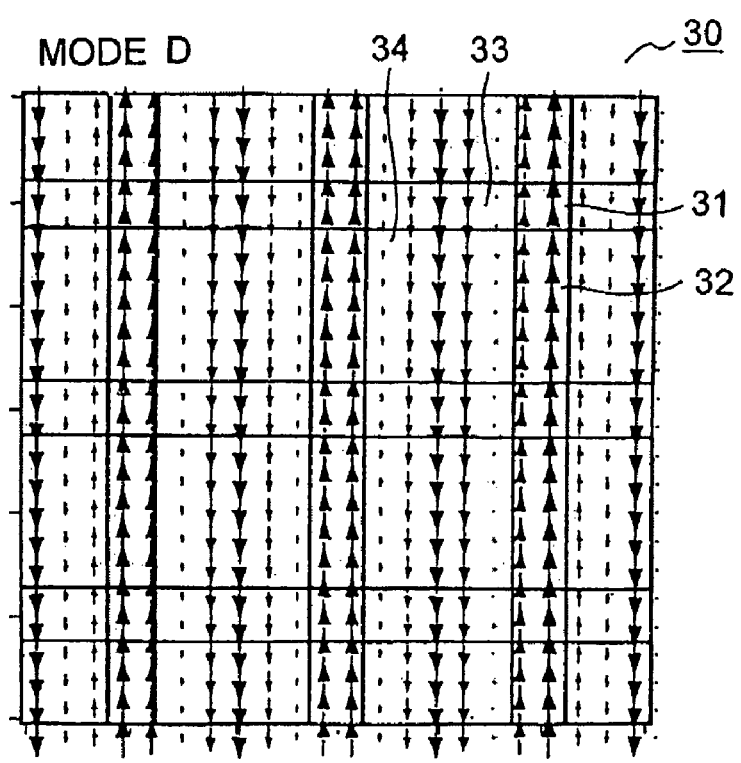
FIG. 33 is a diagram showing the electric field distribution in the near field pattern in the mode D of the two-dimensional photonic crystal of the seventh embodiment of the invention.

FIG. 29 is a band diagram of the second order Γ point (see FIG. 36, the part S) of the two-dimensional photonic crystal

30. Along the vertical axis is taken the normalized frequency, i.e., the frequency of light normalized by being multiplied by "a/c," and along the horizontal axis is taken the wave-number vector of light. Provided that the refractive indices and sizes of the media and other parameters are appropriately set, the two-dimensional photonic crystal 30 has, at the second order Γ point, four different resonant frequencies and thus four different resonant modes corresponding to those resonant frequencies. That is, the modes C and D have different resonant frequencies, and thus, in the two-dimensional photonic crystal 30, mode degeneration is resolved.

FIGS. 30 to 33 show the electric field distributions in the two-dimensional photonic crystal 30 when it is in the mode-A, mode-B, mode-C, and mode-D resonant states, respectively; that is, these figures show the near field pattern images at the time of laser oscillation. Arrows indicate the directions and magnitudes of electric fields. As shown in these figures, in all the modes, the directions of electric fields are uniform. That is, the polarization direction is uniform. This makes it possible to obtain a two-dimensional photonic crystal surface-emitting laser 9 that emits light of which the polarization direction (the directions of electric fields) is uniform.

Incidentally, the one-dimensional diffraction gratings 8a and 3a have simply to have equal periods, and do not necessarily have equal duty ratios. Instead of cementing together one-dimensional diffraction gratings as in this embodiment, media having a rectangular cross-sectional shape as seen in a plan view and having different refractive indices may be arrayed in close contact with one another as shown in FIG. 28 described above so that, with respect to blocks of one medium (for example, the first medium), blocks of two other media (for example, the second and third media 32 and 33) adjacent thereto in two mutually perpendicular directions have different refractive indices. Also in this way, it is possible to obtain a two-dimensional photonic crystal free from mode degeneration.

Here, blocks of the one medium are arrayed at intervals equal to the wavelength or equal to a period that fulfills the conditions for the wave-number vector at the point Γ defined earlier. While the fundamental lattice is square, blocks of the individual media do not have to be square as seen in a plan view. The fourth medium 34 of which blocks are arrayed in oblique directions with respect to the one medium (the first medium 31) may have the same refractive index as one of the first to third media 31 to 33.

FIG. 34 shows the frequency response of the gain of the active layer 4 in the first to seventh embodiments. Along the vertical axis is taken the gain of the active layer, and along the horizontal axis is taken the frequency. As shown in this figure, the active layer 4 exhibits different gains at different frequencies. Accordingly, in the first to seventh embodiments, by appropriately setting the parameters of the two-dimensional photonic crystal, such as the refractive indices and sizes of the media and the lattice constant, so that resonance occurs at the frequency at which the gain of the active layer 4 is at the maximum, it is possible to let the two-dimensional photonic crystal emit light efficiently and thereby save power consumption. Moreover, making the differences between the frequencies of the different modes greater makes it easy to select the resonance mode used.

INDUSTRIAL APPLICABILITY

As described above, according to the present invention, in a two-dimensional photonic crystal, the fundamental lattice has a refractive index distribution that is asymmetric with respect to the diagonal lines thereof. This helps resolve mode degeneration, and thus makes it possible to obtain a two-dimensional photonic crystal surface-emitting laser that emits light of which the polarization direction is uniform.

According to the present invention, by resolving mode degeneration in the two-dimensional photonic crystal, it is possible to obtain a two-dimensional photonic crystal surface-emitting laser that emits light of which the polarization direction is uniform.

According to the present invention, the frequency at which the active layer exhibits the maximum gain is made coincident with the frequency at which the two-dimensional photonic crystal resonates. This makes it possible to let the two-dimensional photonic crystal emit light efficiently and thereby save power consumption.

According to the present invention, a third medium is arrayed asymmetrically with respect to the two diagonal lines of the fundamental lattice that has its vertices at patches of a second medium arrayed in a first medium. This makes it easy to obtain a two-dimensional photonic crystal having an asymmetric refractive index distribution.

According to the present invention, assuming that the length of each side of the fundamental lattice is "a," patches of the third medium are arrayed within a width of "0.1a" of one side of the fundamental lattice or within a width of "0.1a" of the bisecting normal to one side of the fundamental lattice. This makes the effect of the photonic crystal on light greater, and makes it easy to resolve mode degeneration.

According to the present invention, assuming that the length of each side of the fundamental lattice is "a" and that the first and second directions are, with an origin set at a patch of the second medium, the X- and Y-axes, patches of the third medium are arrayed within a radius of "0.1a" of points of which the X- and Y-coordinates are (na/4, ma/4), where n=0, 2, and 4, and m=1 and 3 or (na/4, ma/4), where n=1 and 3, and m=0, 2, and 4.

This helps introduce defects and thereby achieve a greater effect of resolving mode degeneration.

According to the present invention, the patches of the second medium and the patches of the third medium are differently sized. This makes it easy to form an asymmetric refractive index distribution even when the second and third media have the same refractive index.

According to the present invention, the second medium and the third medium are formed of the same material. This makes it possible to form patches of the second and third media simultaneously, and makes it easier to form an asymmetric refractive index distribution.

According to the present invention, the patches of the second medium, as seen in a plan view, are given an asymmetrical shape with respect to the two diagonal lines of the fundamental lattice that has its vertices at patches of the second medium arrayed in the first medium. This makes it easy to obtain a two-dimensional photonic crystal having an asymmetric refractive index distribution.

According to the present invention, patches of different media, each rectangular in shape as seen in a plan view, are arrayed in close contact with one another in a checkered pattern, and, with respect to the patches of one medium, the patches of two other media adjacent thereto in two mutually perpendicular directions have different refractive indices. This makes it easy to obtain a two-dimensional photonic crystal having an asymmetric refractive index distribution.

According to the present invention, two one-dimensional diffraction gratings are cemented together in such a way that the directions of the periods thereof are perpendicular to each other. This makes it easy to obtain a two-dimensional photonic crystal having different media arrayed in a checkered pattern.

The invention claimed is:

1. A two-dimensional photonic crystal surface-emitting laser having a two-dimensional photonic crystal placed near an active layer that emits light when carriers are injected thereinto, the two-dimensional photonic crystal comprising:
    a first medium having a predetermined refractive index and
    an array of patches of a second medium, the array of patches of the second medium arrayed inside the first medium, the second medium having a different refractive index from the first medium,
    wherein all mode degeneration at a $\Gamma$ point of the two-dimensional photonic crystal is resolved,
    wherein the patches of the second medium are arrayed at equal intervals in mutually perpendicular first and second directions within the first medium, the array of patches of the second medium thereby forming a square lattice,
    wherein a fundamental lattice that repeats with a minimum period and having patches of the second medium at the vertices thereof forms the square lattice, and
    wherein at least in part of the fundamental lattices, the patches of the second medium, as seen in a plan view, are asymmetric with respect to one of two diagonal lines of the corresponding fundamental lattices.

2. A two-dimensional photonic crystal surface-emitting laser as claimed in claim 1,
    wherein a frequency at which the active layer exhibits a maximum gain is coincident with a frequency at which the two-dimensional photonic crystal resonates.

3. A two-dimensional photonic crystal surface-emitting laser as claimed in claim 1,
    wherein the patches of the second medium have an elliptic cross-sectional shape.

4. A two-dimensional photonic crystal surface-emitting laser having a two-dimensional photonic crystal placed near an active layer that emits light when carriers are injected thereinto, the two-dimensional photonic crystal comprising:
    a first medium having a predetermined refractive index and
    an array of elliptical patches of a second medium, the array of elliptical patches of the second medium arrayed at equal intervals in mutually perpendicular first and second directions inside the first medium thereby forming a square lattice, the second medium having a different refractive index from the first medium,
    wherein all mode degeneration at a $\Gamma$ point of the two-dimensional photonic crystal is resolved,
    wherein a fundamental lattice that repeats with a minimum period and having elliptical patches of the second medium at the vertices thereof forms the square lattice, and
    wherein at least in part of the fundamental lattices, the elliptical patches of the second medium, as seen in a plan view, are asymmetric with respect to one of two diagonal lines of the corresponding fundamental lattices.

5. A two-dimensional photonic crystal surface-emitting laser as claimed in claim 4,
    wherein a frequency at which the active layer exhibits a maximum gain is coincident with a frequency at which the two-dimensional photonic crystal resonates.

6. A two-dimensional photonic crystal surface-emitting laser as claimed in claim 4,
    wherein a major axis of each elliptical patch of the second medium is parallel to one of the first and second directions.

7. A two-dimensional photonic crystal surface-emitting laser as claimed in claim 6,
    wherein a frequency at which the active layer exhibits a maximum gain is coincident with a frequency at which the two-dimensional photonic crystal resonates.

* * * * *